(12) United States Patent
Chun et al.

(10) Patent No.: US 9,496,216 B2
(45) Date of Patent: Nov. 15, 2016

(54) SEMICONDUCTOR PACKAGE INCLUDING STACKED SEMICONDUCTOR CHIPS AND A REDISTRIBUTION LAYER

(71) Applicants: Sung-Hoon Chun, Hwaseong-si (KR);
Hye-Jin Kim, Hwaseong-si (KR);
Sang-Ho An, Suwon-si (KR);
Kyung-Man Kim, Hwaseong-si (KR);
Seok-Chan Lee, Hwaseong-si (KR)

(72) Inventors: Sung-Hoon Chun, Hwaseong-si (KR);
Hye-Jin Kim, Hwaseong-si (KR);
Sang-Ho An, Suwon-si (KR);
Kyung-Man Kim, Hwaseong-si (KR);
Seok-Chan Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 446 days.

(21) Appl. No.: 13/725,132

(22) Filed: Dec. 21, 2012

(65) Prior Publication Data

US 2013/0161788 A1  Jun. 27, 2013

(30) Foreign Application Priority Data

Dec. 22, 2011  (KR) .................. 10-2011-0139829
May 22, 2012  (KR) .................. 10-2012-0054414
Nov. 19, 2012  (KR) .................. 10-2012-0130947

(51) Int. Cl.
*H01L 21/02* (2006.01)
*H01L 23/50* (2006.01)
(Continued)

(52) U.S. Cl.
CPC ........... *H01L 23/50* (2013.01); *H01L 23/5223* (2013.01); *H01L 24/05* (2013.01); *H01L 24/49* (2013.01); *H01L 25/0652* (2013.01); *H01L 25/0657* (2013.01); *H01L 25/18* (2013.01); *H01L 23/525* (2013.01); *H01L 24/06* (2013.01); *H01L 24/13* (2013.01); *H01L 24/16* (2013.01); *H01L 24/32* (2013.01); *H01L 24/45* (2013.01); *H01L 24/48* (2013.01); *H01L 24/73* (2013.01); *H01L 28/40* (2013.01); *H01L 2224/02166* (2013.01); *H01L 2224/02375* (2013.01); *H01L 2224/02381* (2013.01); *H01L 2224/0401* (2013.01); *H01L 2224/04042* (2013.01); *H01L 2224/05548* (2013.01); *H01L 2224/05553* (2013.01); *H01L 2224/05554* (2013.01);
(Continued)

(58) Field of Classification Search
CPC ...................................... H01L 23/50
USPC ...................................... 257/532
See application file for complete search history.

(56) References Cited

U.S. PATENT DOCUMENTS 5,798,282 A  8/1998  Bertin et al.
6,621,155 B1  9/2003  Perino et al.
(Continued)

FOREIGN PATENT DOCUMENTS

JP  2006351664  12/2006
JP  2008-085059 A  4/2008
(Continued)

*Primary Examiner* — John C Ingham
*Assistant Examiner* — Ismail Muse
(74) *Attorney, Agent, or Firm* — Myers Bigel & Sibley, P.A.

(57) ABSTRACT

Semiconductor packages including stacked semiconductor chips are provided. The semiconductor packages may include first semiconductor chips and a second semiconductor chip that are stacked sequentially on a board. The semiconductor packages may also include a wiring layer on the memory chips and the wiring layer may include redistribution patterns and redistribution pads. Each of the memory chips may include a data pad. The data pads of the first semiconductor chips may be electrically connected to the board via the second semiconductor chip, some of redistribution patterns, and some of redistribution pads.

30 Claims, 28 Drawing Sheets

(51) Int. Cl.
*H01L 25/065* (2006.01)
*H01L 25/18* (2006.01)
*H01L 23/522* (2006.01)
*H01L 49/02* (2006.01)
*H01L 23/00* (2006.01)
*H01L 23/525* (2006.01)

(52) U.S. Cl.
CPC ............... *H01L2224/05567* (2013.01); *H01L 2224/06102* (2013.01); *H01L 2224/06135* (2013.01); *H01L 2224/131* (2013.01); *H01L 2224/16135* (2013.01); *H01L 2224/32145* (2013.01); *H01L 2224/32225* (2013.01); *H01L 2224/45124* (2013.01); *H01L 2224/45144* (2013.01); *H01L 2224/4813* (2013.01); *H01L 2224/48091* (2013.01); *H01L 2224/48137* (2013.01); *H01L 2224/48145* (2013.01); *H01L 2224/48147* (2013.01); *H01L 2224/48195* (2013.01); *H01L 2224/48227* (2013.01); *H01L 2224/48463* (2013.01); *H01L 2224/48465* (2013.01); *H01L 2224/49109* (2013.01); *H01L 2224/49171* (2013.01); *H01L 2224/49175* (2013.01); *H01L 2224/49177* (2013.01); *H01L 2224/73207* (2013.01); *H01L 2224/73265* (2013.01); *H01L 2225/0651* (2013.01); *H01L 2225/06506* (2013.01); *H01L 2225/06527* (2013.01); *H01L 2225/06562* (2013.01); *H01L 2924/00014* (2013.01); *H01L 2924/1431* (2013.01); *H01L 2924/1434* (2013.01); *H01L 2924/15184* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01)

(56) References Cited

U.S. PATENT DOCUMENTS

| | | | |
|---|---|---|---|
| 6,995,448 | B2 | 2/2006 | Lee et al. |
| 7,217,597 | B2 | 5/2007 | Akram |
| 7,659,610 | B2 | 2/2010 | Chen et al. |
| 7,705,450 | B2 | 4/2010 | Vinson et al. |
| 7,843,089 | B2 | 11/2010 | Ito et al. |
| 7,855,446 | B2 | 12/2010 | Nishiyama et al. |
| 7,867,819 | B2 | 1/2011 | Upadhyayula et al. |
| 7,880,312 | B2 | 2/2011 | Okumura |
| 7,888,796 | B2 | 2/2011 | Shinohara |
| 7,989,960 | B2 | 8/2011 | Shinohara et al. |
| 8,080,868 | B2 | 12/2011 | Nishiyama et al. |
| 8,097,954 | B2 | 1/2012 | Ozawa et al. |
| 8,142,966 | B2 | 3/2012 | Izikson et al. |
| 8,288,855 | B2 | 10/2012 | Nishiyama et al. |
| 8,508,046 | B2 | 8/2013 | Sakuma et al. |
| 2006/0157866 | A1 | 7/2006 | Le et al. |
| 2009/0108470 | A1* | 4/2009 | Okada ............... H01L 24/48 257/777 |
| 2009/0200680 | A1* | 8/2009 | Shinohara ............ G11C 5/02 257/773 |
| 2010/0007014 | A1 | 1/2010 | Suzuki et al. |
| 2010/0078635 | A1 | 4/2010 | Kuroda et al. |
| 2010/0102430 | A1 | 4/2010 | Lee et al. |
| 2010/0164084 | A1 | 7/2010 | Lee et al. |
| 2010/0270689 | A1 | 10/2010 | Kim et al. |
| 2011/0042795 | A1 | 2/2011 | Knickerbocker |
| 2011/0089575 | A1 | 4/2011 | Lee |
| 2011/0090662 | A1 | 4/2011 | Jang et al. |
| 2011/0140237 | A1 | 6/2011 | Han |
| 2011/0161583 | A1 | 6/2011 | Youn |
| 2011/0165776 | A1 | 7/2011 | Hsu et al. |
| 2011/0233788 | A1* | 9/2011 | Shinohara ............ G11C 5/02 257/773 |
| 2011/0317387 | A1* | 12/2011 | Pan ............... H01L 23/49822 361/782 |
| 2012/0025349 | A1 | 2/2012 | Lee et al. |

FOREIGN PATENT DOCUMENTS

| | | |
|---|---|---|
| JP | 2009-129967 A | 6/2009 |
| JP | 2009-188328 A | 8/2009 |
| JP | 2010109206 | 5/2010 |
| JP | 2011034990 | 2/2011 |
| JP | 2011061186 | 3/2011 |
| JP | 2011086943 | 4/2011 |
| KR | 10-1997-0005698 B1 | 4/1997 |
| KR | 10-2000-0008016 A | 2/2000 |
| KR | 10-2003-0006510 A | 1/2003 |
| KR | 10-2005-0075524 A | 7/2005 |
| KR | 10-2006-0055863 A | 5/2006 |
| KR | 10-2007-0018331 A | 2/2007 |
| KR | 10-0688581 B1 | 2/2007 |
| KR | 10-2008-0005741 A | 1/2008 |
| KR | 10-2009-0021452 A | 3/2009 |
| KR | 10-2011-0123037 A | 11/2011 |

* cited by examiner

SEMICONDUCTOR PACKAGE INCLUDING STACKED SEMICONDUCTOR CHIPS AND A REDISTRIBUTION LAYER

CROSS-REFERENCE TO RELATED APPLICATION

This U.S. non-provisional patent application claims priority under 35 U.S.C. §119 to Korean Patent Application No. 10-2012-130947 filed on Nov. 19, 2012, Korean Patent Application No. 10-2012-54414 filed on May 22, 2012, and Korean Patent Application No. 10-2011-139829 filed on Dec. 22, 2011, in the Korean Intellectual Property Office, the disclosures of all of which are hereby incorporated by reference in their entireties.

FIELD

The present disclosure generally relates to the field of electronics, and more particular to a semiconductor device.

BACKGROUND

Technologies for semiconductor packages including various semiconductor chips, specifically technologies for arranging and connecting semiconductor chips, have been developed for mobile devices.

Semiconductor packages may include several memory chips and a logic chip on the memory chips, where those chips may be arranged to reduce the size of semiconductor package and to enable high speed operation. Some semiconductor packages may additionally include passive devices, such as a multi-layer ceramic capacitor (MLCC), or an integrated passive device (IPD), and those devices may be arranged to reduce their sizes and to increase their operation speeds.

SUMMARY

A semiconductor package may include a plurality of first semiconductor chips including an uppermost first semiconductor chip on a board and the plurality of first semiconductor chips may include respective ones of a plurality of data pads and respective ones of a plurality of power pads. The plurality of data pads may include a first data pad in the uppermost first semiconductor chip. The semiconductor package may also include a wiring layer on the uppermost first semiconductor chip and the wiring layer may include a redistribution pattern and a redistribution pad that may be electrically connected to the redistribution pattern. The semiconductor package may further include a second semiconductor chip on the uppermost first semiconductor chip and the second semiconductor chip may be electrically connected to the redistribution pattern. Moreover, the semiconductor package may include a plurality of first conductive connections between two of the plurality of data pads, a second conductive connection between the uppermost first semiconductor chip and the second semiconductor chip, and a third conductive connection between the second semiconductor chip and the board. One of the plurality of data pads may be electrically connected to the board via the second conductive connection, the second semiconductor chip, the redistribution pattern, the redistribution pad and the third conductive connection.

In various embodiments, the redistribution pad may be one among a plurality of redistribution pads, and one of the plurality of redistribution pads may directly contact the first data pad in the uppermost first semiconductor chip.

According to various embodiments, a center of the second semiconductor chip may be closer to one of the plurality of data pads than one of the plurality of power pads.

In various embodiments, a first data path between one of the plurality of first semiconductor chips and the second semiconductor chip may be shorter than a second data path between the second semiconductor chip and the board.

According to various embodiments, the redistribution pattern may include a first redistribution pattern between the uppermost first semiconductor chip and the second semiconductor chip and a second redistribution pattern between the second semiconductor chip and the board. The first redistribution pattern may not overlap with the second redistribution pattern and may be shorter than the second redistribution pattern, and one of the plurality of data pads may be electrically connected to the board via the first redistribution pattern, the second conductive connection, the second semiconductor chip, the second redistribution pattern, and the third conductive connection, sequentially.

In various embodiments, the redistribution pattern may be between the second semiconductor chip and the board and the redistribution pad may include a first redistribution pad between the first data pad in the uppermost first semiconductor chip and the second semiconductor chip, a second redistribution pad electrically connected to the redistribution pattern, a third redistribution pad electrically connected to the redistribution pattern. The third redistribution pad may contact the third conductive connection and the second semiconductor chip may be closer to the first redistribution pad than the third redistribution pad, and one of the plurality of data pads may be electrically connected to the board via the first redistribution pad, the second conductive connection, the second semiconductor chip, the second redistribution pad, the redistribution pattern, the third redistribution pad, and the third conductive connection, sequentially.

According to various embodiments, the redistribution pattern may be one among a plurality of redistribution patterns and the redistribution pad may be one among a plurality of redistribution pads and the semiconductor package may further include a fourth conductive connection between two of the plurality of redistribution pads and the fourth conductive connection may cross over a first one of the plurality of redistribution patterns while being spaced apart from the first one of the plurality of redistribution patterns, and may include a bonding wire, a beam lead, or a conductive tape.

In various embodiments, the wiring layer may be smaller than the uppermost first semiconductor chip, may overlap with the uppermost first semiconductor chip and may not overlap with the second semiconductor chip.

According to various embodiments, all of the plurality of data pads may be electrically connected to the board via the second semiconductor chip, the redistribution pad, redistribution pattern, and the third conductive connection, sequentially.

In various embodiments, the board may include a board internal wiring and the board internal wiring may be connected to one of the plurality of power pads or the second semiconductor chip.

According to various embodiments, the board may be free of a wiring connecting one of the plurality of data pads and the second semiconductor chip.

In various embodiments, a ratio of a longer side to a shorter side of the second semiconductor chip may be about 1.2 or less.

According to various embodiments, one of the plurality of power pads may be connected to the board without going through the second semiconductor chip.

In various embodiments, the semiconductor package may further include a buffer chip electrically connected to the second semiconductor chip.

According to various embodiments, the buffer chip may be on the wiring layer.

In various embodiments, the redistribution pattern may include a first redistribution pattern between the first data pad in the uppermost first semiconductor chip and the second semiconductor chip, a second redistribution pattern between the second semiconductor chip and the board and a third redistribution pattern between the second semiconductor chip and the buffer chip. The buffer chip may be connected to the second semiconductor chip via the third redistribution pattern.

In various embodiments, the plurality of first semiconductor chips may include a first chip stack including a first portion of the plurality of first semiconductor chips that are sequentially offset-aligned in a first direction and a second chip stack including a second portion of the plurality of first semiconductor chips that are sequentially offset-aligned in a second direction that may be different from the first direction, the second chip stack being between the first chip stack and the board. The semiconductor package may further include an intermediate wiring layer between the first chip stack and the second chip stack and one of the plurality of first semiconductor chips in the second chip stack may be electrically connected to the wiring layer via the intermediate wiring layer.

A semiconductor package may include a board including a board electrode, a top chip on the board including a first top chip data pad and a second top chip data pad. The semiconductor package may also include an intervening chip between the board and the top chip and the intervening chip may include an intervening chip data pad that may be electrically connected to the first top chip data pad. The semiconductor package may further include a wiring layer on the intervening chip, a first connector connecting the second top chip data pad to a first portion of the wiring layer and a second connector connecting a second portion of the wiring layer to the board electrode. The intervening chip data pad may be electrically connected to the board electrode via the first top chip data pad, the top chip, the second top chip data pad, the first connector, the wiring layer and the second connector and the second top chip data pad, the first portion of the wiring layer, the second portion of the wiring layer and the board electrode may be daisy-chained together.

In various embodiments, the intervening chip may include a first intervening chip including a first intervening chip data pad that may be electrically connected to the first top chip data pad and a second intervening chip between the first intervening chip and the board, the second intervening chip including a second intervening chip data pad and the semiconductor package may further include a chip connector connecting the first intervening chip data pad to the second intervening chip data pad. The second intervening chip data pad may be electrically connected to the board electrode via the chip connector, the first top chip data pad, the top chip, the second top chip data pad, the first connector, the wiring layer, and the second connector.

According to various embodiments, the wiring layer may include an insulation layer, a redistribution pattern in the insulation layer and a first redistribution pad and a second redistribution pad in the insulation layer, the first redistribution pad and the second redistribution pad being electrically connected to the redistribution pattern. The second top chip data pad, the first redistribution pad, the second redistribution pad and the board electrode may be daisy-chained together.

In various embodiments, the wiring layer may contact an upper surface of the intervening chip contacting the top chip and does not overlap with the top chip.

According to various embodiments, a portion of the wiring layer may be between the top chip and the intervening chip and overlaps with the top chip.

In various embodiments, the semiconductor package may also include a bottom chip between the board and the intervening chip and the bottom chip may be smaller than the intervening chip and overlaps with the intervening chip. Additionally, the semiconductor package may include supporter between the board and the intervening chip and wherein the supporter may overlap with the intervening chip while not overlapping with the bottom chip and may be configured to support the intervening chip to reduce deflection of the intervening chip toward the board.

According to various embodiments, the bottom chip may include a DRAM or a SRAM.

In various embodiments, the semiconductor package may further include an adhesive layer between the bottom chip and the intervening chip.

According to various embodiments, the semiconductor package may also include a third connector connecting the bottom chip to the board and wherein a portion of third connector may be in the adhesive layer.

In various embodiments, the semiconductor package may include a passive device on a first surface of the intervening chip on which the top chip located and the passive device may be electrically connected to the top chip and does not overlap with the top chip.

According to various embodiments, the passive device may include a multi-layer ceramic capacitor (MLCC), an integrated passive device (IPD), or a combination of thereof.

In various embodiments, the wiring layer may include a redistribution pattern, and the passive device may be electrically connected to the top chip via the redistribution pattern.

According to various embodiments, the wiring layer may include a decoupling capacitor that may be electrically connected to the top chip.

DETAILED DESCRIPTION OF THE EMBODIMENTS

Figure 1:
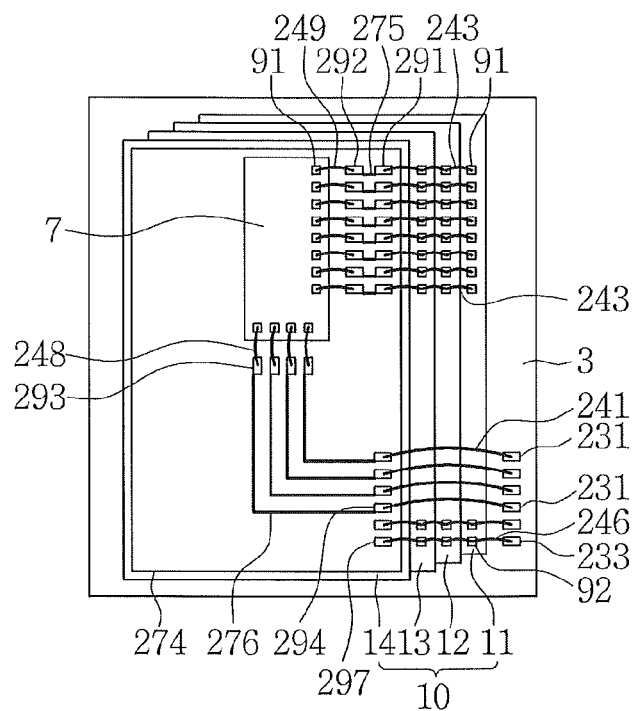
FIGS. 1, 5, 7, 8, 10, 12, 15, 22A, 23, 25, 28, 29, 31, 33, 35, 36, and 41 are layouts for describing semiconductor packages in accordance with some embodiments of the inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

According to the some embodiments of the inventive concept, semiconductor packages may include a board, a logic chip on the board and memory chips between the board and the logic chip. The semiconductor packages may also include a wiring layer on the memory chips and the wiring layer may include redistribution patterns and redistribution pads. Each of the memory chips may include a data pad. The data pads of the memory chips may be electrically connected to the board via the logic chip, some of redistribution patterns, and some of redistribution pads. Specifically, the logic chip, one of redistribution pattern and the board may be all daisy-chained together. The board may not have any wiring connecting the data pads of the memory chips to the board.

The wiring layer may cover the top chip of the memory chips while overlapping with the logic chip. In some embodiments, the wiring layer may partially cover the top chip of the memory chips without overlapping with the logic chip.

The wiring layer may additionally include a decoupling capacitor that is electrically connected to the logic chip and the decoupling capacitor may be electrically connected to the logic chip via one of the redistribution patterns and one of the redistribution pads.

The semiconductor packages may additionally include a buffer chip, such as a DRAM or SRAM, on the memory chips and the buffer chip may be electrically connected to the logic chip via one of the redistribution patterns and one of the redistribution pads. In some embodiments, the buffer chip may be between the board and the memory chips and the semiconductor packages may also include a supporter on the board adjacent to the buffer chip to support the upper structure including the memory chip and the logic chip. The supporter may be configured to make the upper structure and the board parallel and reduce deflection.

The semiconductor packages may additionally include a passive device, such as a multi-layer ceramic capacitor (MLCC), an integrated passive device (IPD), or a combination of thereof, on the memory chips and the passive device may be electrically connected to the logic chip via one of the redistribution patterns and one of the redistribution pads.

Figure 2A:
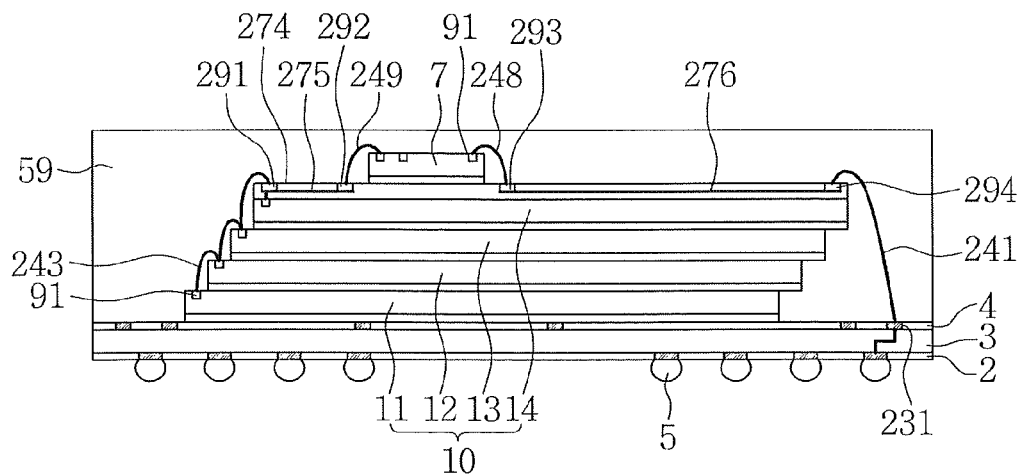
FIGS. 2A, 3, 6, 9, 11, 13, 14, 16 to 21, 24, 26, 27, 30, 32, 34, 38, and 40 are cross-sectional views for describing semiconductor packages in accordance with some embodiments of the inventive concept.
Figure 2B:
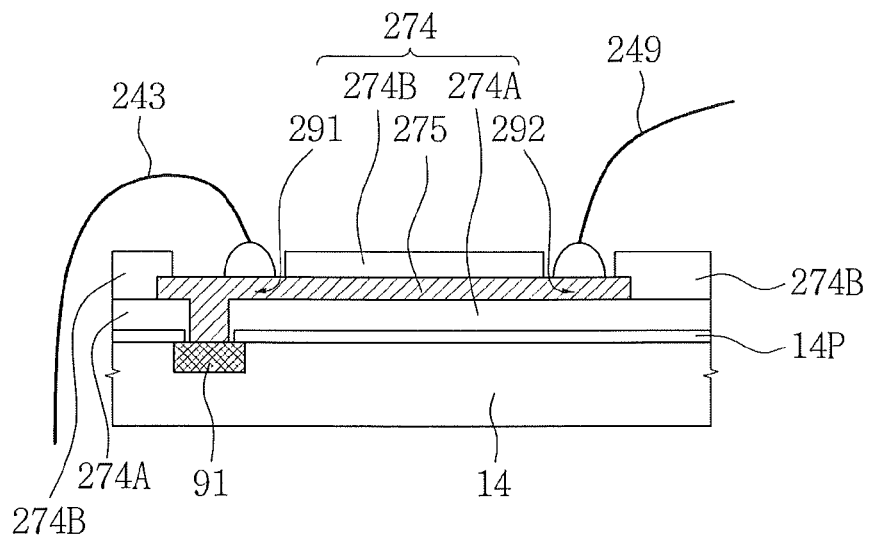
FIG. 2B is a cross-sectional view showing a part of FIG. 2A in detail.
Figure 3:
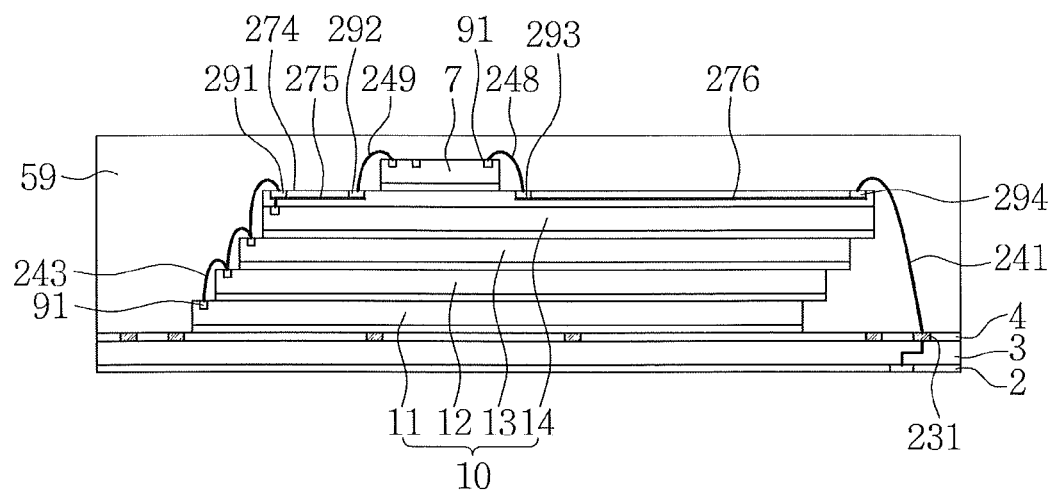
Figure 4:
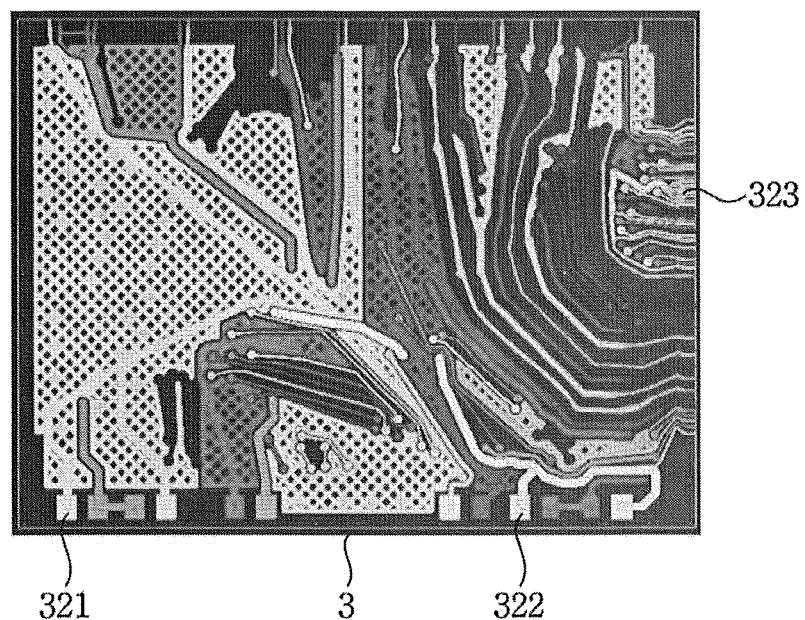
FIG. 4 is a layout showing wirings in a board for describing a semiconductor package in accordance with some embodiments of the inventive concept.

FIG. 1 is a layout for describing a semiconductor package in accordance with some embodiments of the inventive concept, FIGS. 2A and 3 are cross-sectional views for describing a semiconductor package in accordance with some embodiments of the inventive concept, FIG. 2B is a partial cross-sectional view showing a part of FIG. 2A in detail, and FIG. 4 is a layout showing a wiring in a board for describing a semiconductor package in accordance with some embodiments of the inventive concept.

Referring to FIGS. 1 and 2A, a first chip stack 10 may be mounted on a board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of first redistribution pads 291, a plurality of second redistribution pads 292, a plurality of third redistribution pads 293, a plurality of fourth redistribution pads 294, and a plurality of fifth redistribution pads 297 may be formed in the redistribution layer 274. A logic chip 7 may be mounted on the redistribution layer 274. An encapsulant 59 covering the first chip stack 10 and the logic chip 7 may be formed on the board 3. First to fifth conductive connections 241, 243, 246, 248, and 249 may be provided in the encapsulant 59. The plurality of memory chips 11, 12, 13, and 14 and the logic chip 7 may include a plurality of data pads 91 and a plurality of power pads 92.

In some embodiments, the redistribution layer 274 may be referred to as an upper wiring layer.

The plurality of data pads 91 may not be connected to the logic chip 7 via the board 3. As appreciated by the present inventors, if the plurality of data pads 91 were connected to the logic chip 7 via the board 3, the electrical connection paths between the plurality of memory chips 11, 12, 13, and 14 and the logic chip 7 may be longer, which may make higher speed operation more difficult to achieve. Moreover, when the plurality of data pads 91 are connected to the logic chip 7 via the board, the board 7 may need to have internal wirings in the board 3 to transfer data between the plurality of memory chips 11, 12, 13, and 14 and the logic chip 7, thereby making routings of the board 7 more complicated, and which may result in the semiconductor package being larger than needed.

Each of the first to fifth conductive connections 241, 243, 246, 248, and 249 may include a bonding wire, a beam lead, a conductive tape, a conductive spacer, a through-electrode, a solder ball, a solder bump, or a combination thereof. For example, the first to fifth conductive connections 241, 243, 246, 248, and 249 may be bonding wires.

The board 3 may include a rigid printed circuit board, a flexible printed circuit board, or a rigid-flexible printed circuit board. A bottom surface of the board 3 may be covered by a lower solder resist 2, and a top surface of the board 3 may be covered by an upper solder resist 4. First electrode fingers 231 and second electrode fingers 233 may be formed on the board 3. External terminals 5 passing through the lower solder resist 2 may be formed on the bottom surface of the board 3. The first electrode finger 231 may be electrically connected to one selected from the external terminals 5 through the board 3. The external terminals 5 may include a solder ball, a solder bump, a pin grid array, a lead grid array, a conductive tab, or a combination thereof.

Each of the plurality of memory chips 11, 12, 13, and 14 may include a non-volatile memory device such as a NAND flash memory. The plurality of memory chips 11, 12, 13, and 14 may include the data pads 91. The data pads 91 of the plurality of memory chips 11, 12, 13, and 14 may be data input/output pads and may be daisy-chained together. The plurality of memory chips 11, 12, 13, and 14 may be stacked in a cascade structure. The plurality of memory chips 11, 12, 13, and 14 may be offset-aligned step by step. For example, the plurality of memory chips 11, 12, 13, and 14 may be offset-aligned step by step in a direction of the board 3. Each of the plurality of memory chips 11, 12, 13, and 14 may have a greater width than the logic chip 7.

Each of the first redistribution patterns 275 may have a smaller length than each of the second redistribution patterns 276. The first redistribution patterns 275 and the second redistribution patterns 276 may be spaced apart from each other. First and second redistribution pads 291 and 292 in contact with both ends of the first redistribution patterns 275 may be formed. Third and fourth redistribution pads 293 and 294 in contact with both ends of the second redistribution patterns 276 may be formed. The first redistribution pad 291 may be in contact with or electrically connected to the data pad 91 of the uppermost memory chip 14. In addition, the first redistribution pad 291 may be electrically connected to the plurality of memory chips 11, 12, and 13 via the second conductive connections 243. The second conductive connections 243 may be in contact with the data pads 91 of the memory chips 11, 12, and 13, and the first redistribution pad 291.

In some embodiments, each of the memory chips 11, 12, 13, and 14 may include a volatile memory device such as a dynamic random access memory (DRAM).

The logic chip 7 may be a controller or microprocessor including a logic device. The logic chip 7 may have a smaller width than the plurality of memory chips 11, 12, 13, and 14. The logic chip 7 may be mounted on the redistribution layer 274. The redistribution layer 274 may cover the uppermost memory chip 14. The redistribution layer 274 may be interposed between the logic chip 7 and the uppermost memory chip 14 and may overlap with the logic chip 7. One selected from the data pads 91 of the logic chip 7 may be connected to the second redistribution pad 292 via the fifth conductive connection 249. Another one selected from the data pads 91 of the logic chip 7 may be connected to the third redistribution pad 293 via the fourth conductive connection 248. The first conductive connection 241 may be formed between the fourth redistribution pad 294 and the first electrode finger 231.

The plurality of memory chips 11, 12, 13, and 14 may be electrically connected to the board 3 via the first redistribution pads 291, the first redistribution patterns 275, the second redistribution pads 292, the fifth conductive connections 249, the logic chip 7, the fourth conductive connections 248, the third redistribution pads 293, the second redistribution patterns 276, the fourth redistribution pads 294, and the first conductive connections 241, sequentially. The logic chip 7, the third redistribution pads 293, the fourth redistribution pads 294, and the first electrode finger 231 may be all daisy-chained together.

The third conductive connections 246 may be in contact with the second electrode fingers 233, the power pads 92 of the memory chips 11, 12, and 13, and the fifth redistribution pads 297. The fifth redistribution pads 297 may be in contact with or electrically connected to the power pad 92 of the uppermost memory chip 14 among the memory chips 11, 12, 13, and 14. The power pads 92 of the memory chips 11, 12, 13, and 14 may be directly connected to the second electrode fingers 233 via the third conductive connections 246 without going through the logic chip 7.

Referring to FIG. 2B, the uppermost memory chip 14 may include the data pads 91 and the passivation insulating layer 14P. The passivation insulating layer 14P may cover the uppermost memory chip 14 and expose the data pads 91. The redistribution layer 274 may include a first insulating layer 274A, first redistribution pads 291, first redistribution patterns 275, second redistribution pads 292, and a second insulating layer 274B. The first insulating layer 274A may cover the uppermost memory chip 14. The first redistribution pads 291, the first redistribution patterns 275, and the second redistribution pads 292 may be formed on the first insulating layer 274A. For example, the first redistribution pads 291, the first redistribution patterns 275, and the second redistribution pads 292 may be formed at the same level. The first redistribution pads 291, the first redistribution patterns 275, and the second redistribution pads 292 may be formed not to overlap each other. The first redistribution pads 291 may pass through the first insulating layer 274A to be in direct contact with the data pads 91 of the uppermost memory chip 14. The second insulating layer 274B may cover the first insulating layer 274A and the first redistribution patterns 275, and expose the first redistribution pads 291 and the second redistribution pads 292. The second conductive connections 243 may be formed on the first redistribution pads 291. The fifth conductive connections 249 may be formed on the second redistribution pads 292.

In some embodiments, the first redistribution pads 291, the first redistribution patterns 275, the second redistribution pads 292, the third redistribution pads 293, the second redistribution patterns 276, the fourth redistribution pads 294, and the fifth redistribution pads 297 may be formed at the same level not to overlap each other.

In some embodiments, the first insulating layer 274A or the second insulating layer 274B may be selectively omitted. For example, the first insulating layer 274A may be omitted.

In some embodiments, the redistribution layer 274 may be partially formed on the uppermost memory chip 14.

Referring to FIG. 3, the board 3, the first chip stack 10, the logic chip 7, and the encapsulant 59 may configure a card-type package or a mainboard-mounted-type package. For example, the external terminals (reference number 5 in FIG. 2A) may be also omitted.

Referring to FIG. 4, the board 3 may include board internal wirings 321, 322, and 323. Some of the board internal wirings 321, 322, and 323 may be for supplying power to the memory chips 11, 12, 13, and 14 and the logic chip 7. For example, some of the board internal wirings 321, 322, and 323 may be electrically connected to the second electrode fingers 233 and the third conductive connections 246. Others of the board internal wirings 321, 322, and 323 may be for performing input/output of data and transferring signals with external apparatuses. For example, the others of the board internal wirings 321, 322, and 323 may be electrically connected to the first electrode fingers 231 and the first conductive connections 241.

As shown in FIGS. 1 to 4, the logic chip 7 may be relatively close to the data pads 91 of the memory chips 11, 12, 13, and 14, and relatively far from the power pads 92 of the memory chips 11, 12, 13, and 14. The first redistribution patterns 275, the first redistribution pads 291, the second redistribution pads 292, the second conductive connections 243, and the fifth conductive connections 249 may be interpreted as a first electrical connection path that functions to transfer a data signal between the logic chip 7 and the memory chips 11, 12, 13, and 14. The second redistribution patterns 276, the third redistribution pads 293, the fourth redistribution pads 294, the fourth conductive connections 248, the first conductive connections 241, and the first electrode fingers 231 may be interpreted as a second electrical connection path that functions to transfer a data signal between the logic chip 7 and the board 3. The first electrical connection path may be shorter than the second electrical connection path. The fifth redistribution pads 297, the third conductive connections 246, and the second electrode fingers 233 may be interpreted as a third electrical connection path that functions to transfer power from the board 3 to the memory chips 11, 12, 13, and 14. The board wirings 321, 322, and 323 may be connected to the first electrode fingers 231 and the second electrode fingers 233.

As described above, according to the embodiments of the inventive concept, no wirings that function to transfer a data signal between the logic chip 7 and the memory chips 11, 12, 13, and 14 may be required in the board 3. All wirings that function to transfer a data signal between the logic chip 7 and the memory chips 11, 12, 13, and 14 may be formed at a higher level than the lowermost memory chip 11 among the memory chips 11, 12, 13, and 14.

The logic chip 7 may be formed close to the data pads 91 of the memory chips 11, 12, 13, and 14. The length of the first redistribution pattern 275 may be smaller than that of the second redistribution pattern 276. The electrical connection path between the data pads 91 of the memory chips 11, 12, 13, and 14 and the logic chip 7 may be reduced to be shorter than that between the logic chip 7 and the board 3. The operation speeds of the memory chips 11, 12, 13, and 14 may be relatively slow compared to a signal transfer speed between the logic chip 7 and an external apparatus. The operation speed of a semiconductor package according to embodiments of the present invention may be determined by the memory chips 11, 12, 13, and 14. Reduction of the electrical connection path between the logic chip 7 and the memory chips 11, 12, 13, and 14 may be very effective for increasing the operation speed of the semiconductor package.

Lengths of the first redistribution pattern 275 and the second redistribution pattern 276 may be freely adjusted depending on the location of the logic chip 7. The location of the data pads 91 of the logic chip 7 may be effectively arranged with relation to the first redistribution pattern 275 and the second redistribution pattern 276. The embodiments of the inventive concept may be relatively advantageous to the high integration of the logic chip 7.

Figure 5:
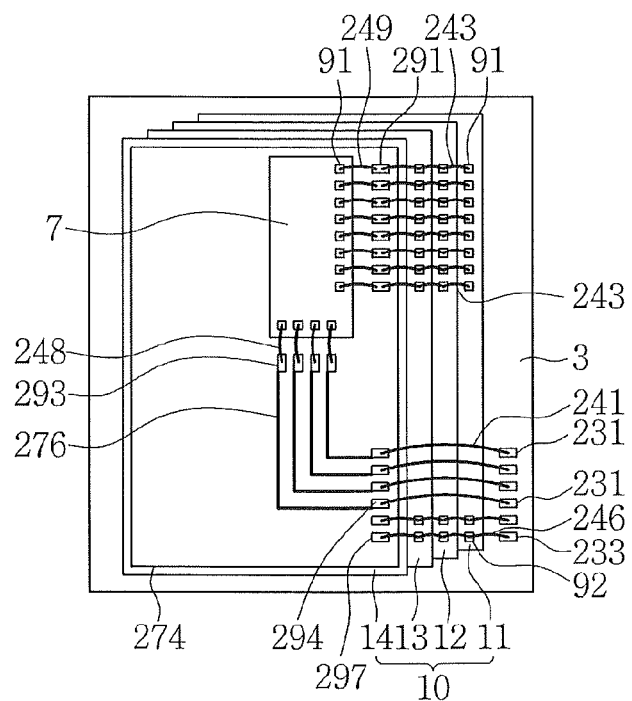
Figure 6:
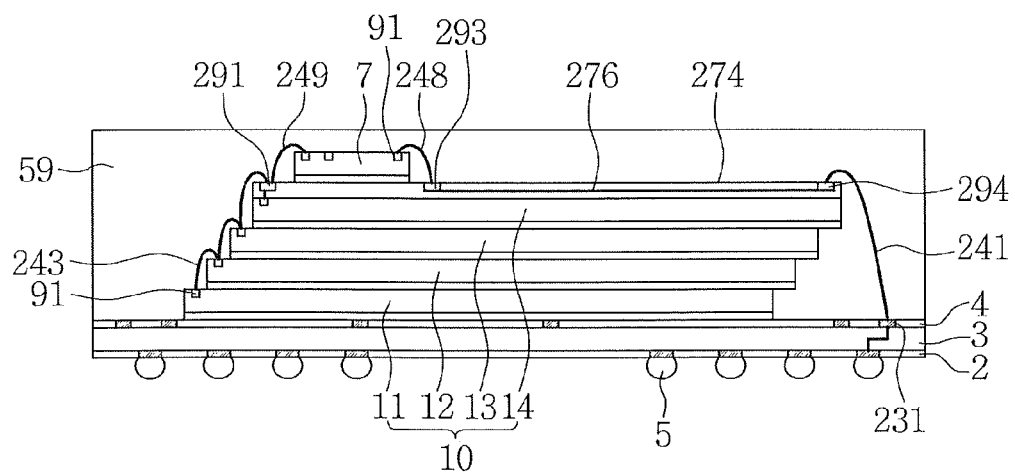

FIG. 5 is a layout for describing a semiconductor package in accordance with some embodiments of the inventive concept, and FIG. 6 is a cross-sectional view for describing a semiconductor package in accordance with some embodiments of the inventive concept.

Referring to FIGS. 5 and 6, a first chip stack 10 may be mounted on a board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of second redistribution patterns 276, a plurality of first redistribution pads 291, a plurality of third redistribution pads 293, a plurality of fourth redistribution pads 294, and a plurality of fifth redistribution pads 297 may be formed in the redistribution layer 274. A logic chip 7 may be mounted on the redistribution layer 274. An encapsulant 59 covering the first chip stack 10 and the logic chip 7 may be formed on the board 3. First to fifth conductive connections 241, 243, 246, 248, and 249 may be formed in the encapsulant 59. The plurality of memory chips 11, 12, 13, and 14 and the logic chip 7 may include a plurality of data pads 91 and a plurality of power pads 92.

The first redistribution patterns (reference number 275 of FIG. 1) and the second redistribution pads (reference number 292 of FIG. 1) may be omitted. The fifth conductive connections 249 may be in contact with the first redistribution pads 291 and the data pads 91 of the logic chip 7.

Figure 7:
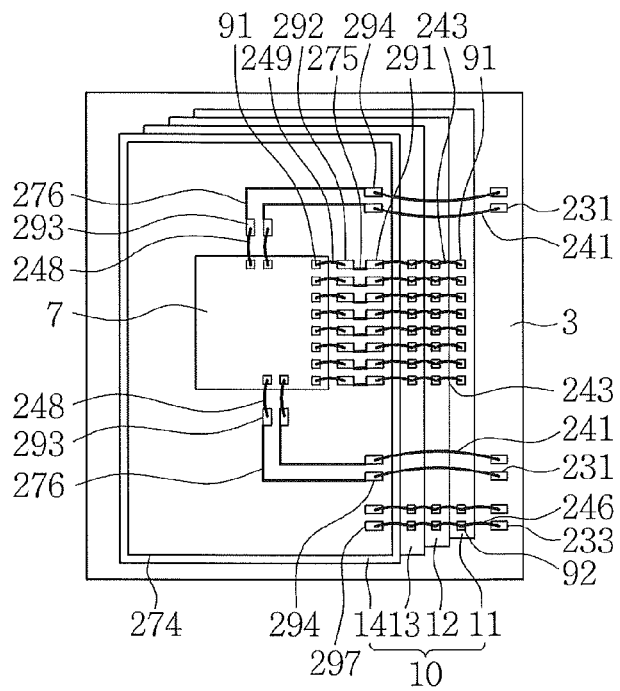

FIG. 7 is a layout for describing a semiconductor package in accordance with some embodiments of the inventive concept.

Referring to FIG. 7, a first chip stack 10 may be mounted on a board 3. The first chip stack 10 may include a plurality of memory chips 11, 12, 13, and 14. A redistribution layer 274 may be formed on the uppermost memory chip 14 among the memory chips 11, 12, 13, and 14. A plurality of first redistribution patterns 275, a plurality of second redistribution patterns 276, a plurality of first redistribution pads 291, a plurality of second redistribution pads 292, a plurality of third redistribution pads 293, a plurality of fourth redistribution pads 294, and a plurality of fifth redistribution pads 297 may be formed in the redistribution layer 274. A logic chip 7 may be mounted on the redistribution layer 274. First to fifth conductive connections 241, 243, 246, 248, and 249 may be provided on the board 3. The plurality of memory chips 11, 12, 13, and 14 and the logic chip 7 may include a plurality of data pads 91 and a plurality of power pads 92.

The first redistribution patterns 275, the second redistribution patterns 276, the first redistribution pads 291, the second redistribution pads 292, the third redistribution pads 293, the fourth redistribution pads 294, and the fifth redistribution pads 297 may be formed to have various positions and lengths. A ratio of a longer side to a shorter side of the logic chip 7 may be 1.2 or less. The ratio of the longer side to the shorter side means a number that results when a length of the longer side is divided by a length of the shorter side.

Figure 8:
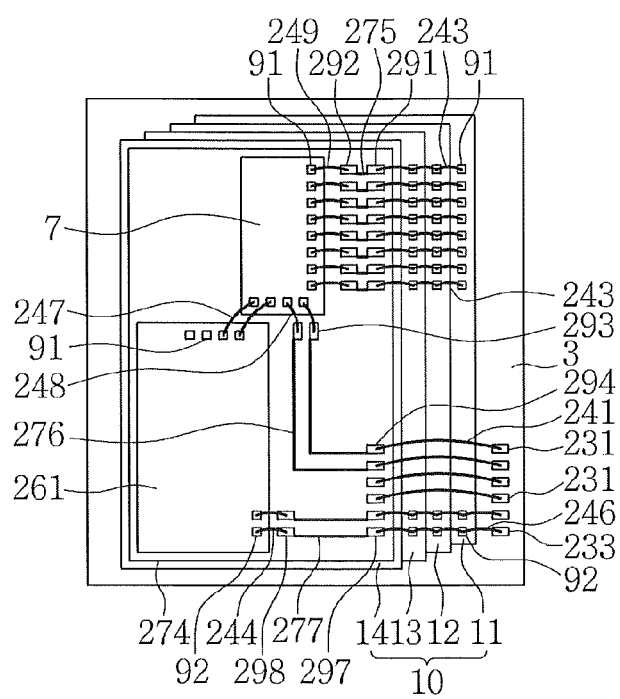
Figure 9:
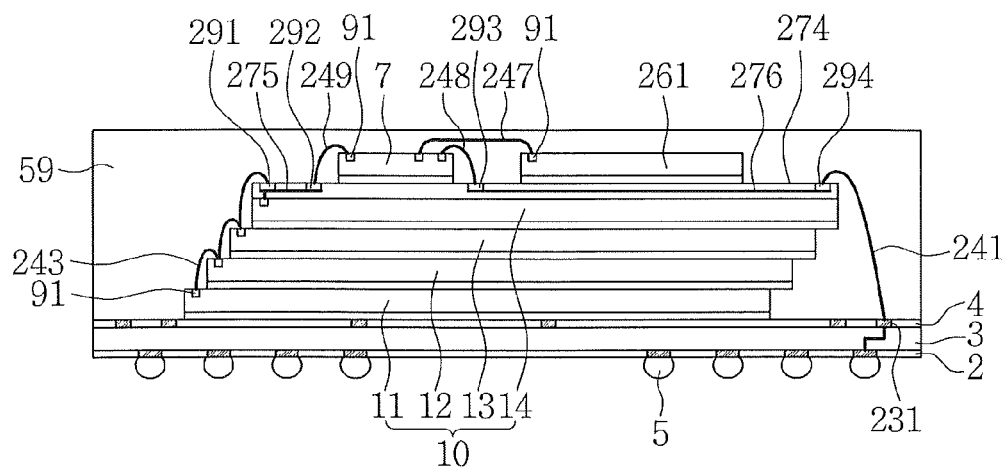

FIG. 8 is a layout for describing a semiconductor package in accordance with some embodiments of the inventive concept, and FIG. 9 is a cross-sectional view for describing a semiconductor package in accordance of the inventive concept.

Referring to FIGS. 8 and 9, a first chip stack 10 may be mounted on a board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of third redistribution patterns 277, a plurality of first redistribution pads 291, a plurality of second redistribution pads 292, a plurality of third redistribution pads 293, a plurality of fourth redistribution pads 294, a plurality of fifth redistribution pads 297, and a plurality of sixth redistribution pads 298 may be formed in the redistribution layer 274. A logic chip 7 and a first buffer chip 261 may be formed on the redistribution layer 274. An encapsulant 59 covering the first chip stack 10, the logic chip 7, and the first buffer chip 261 may be provided on the board 3. First conductive connections 241, second conductive connections 243, third conductive connections 246, fourth conductive connections 248, fifth conductive connections 249, sixth conductive connections 244, and seventh conductive connections 247 may be provided in the encapsulant 59. The memory chips 11, 12, 13, and 14, the first buffer chip 261, and the logic chip 7 may include a plurality of data pads 91 and a plurality of power pads 92.

The first buffer chip 261 may be connected to the logic chip 7 using the seventh conductive connection 247. The third redistribution patterns 277 may be formed between the fifth redistribution pads 297 and the sixth redistribution pads 298. The sixth conductive connections 244 may be formed between the sixth redistribution pads 298 and the power pads 92 of the first buffer chip 261. The first buffer chip 261 may include a volatile memory device such as a DRAM or a static random access memory (SRAM).

Figure 10:
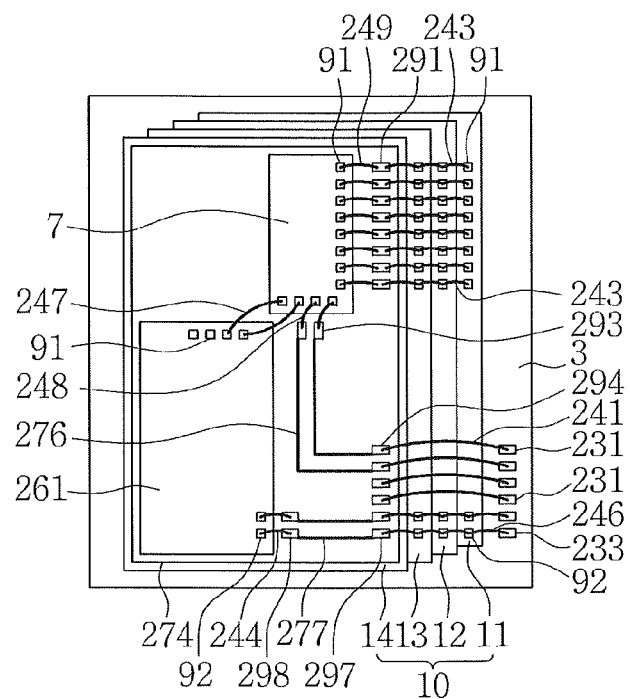
Figure 11:
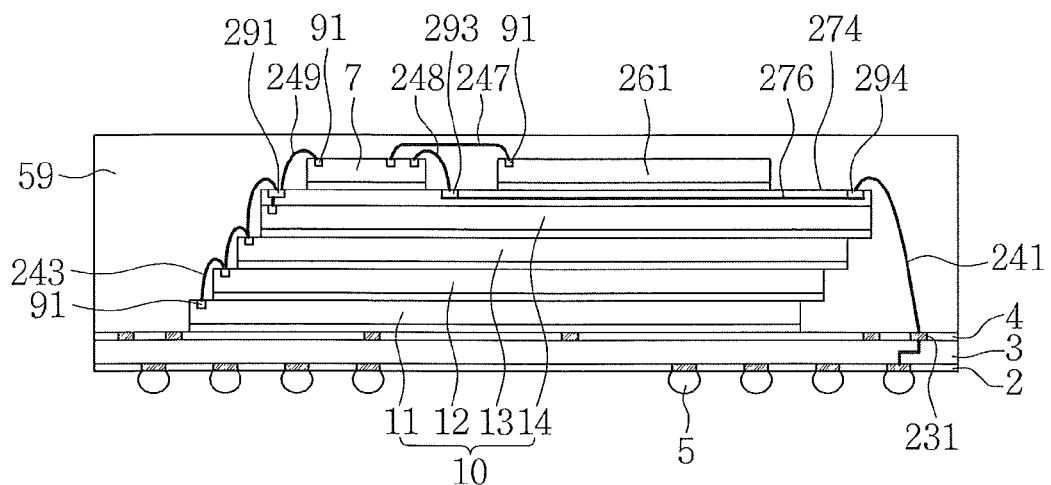

FIG. 10 is a layout for describing a semiconductor package in accordance with some embodiments of the inventive concept, and FIG. 11 is a cross-sectional view for describing a semiconductor package in accordance with some embodiments of the inventive concept.

Referring to FIGS. 10 and 11, a first chip stack 10 may be mounted on a board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of second redistribution patterns 276, a plurality of third redistribution patterns 277, a plurality of first redistribution pads 291, a plurality of third redistribution pads 293, a plurality of fourth redistribution pads 294, a plurality of fifth redistribution pads 297, and a plurality of sixth redistribution pads 298 may be formed in the redistribution layer 274. A logic chip 7 and a first buffer chip 261 may be mounted on the redistribution layer 274. An encapsulant 59 covering the first chip stack 10, the logic chip 7, and the first buffer chip 261 may be provided on the board 3. First conductive connections 241, second conductive connections 243, third conductive connections 246, fourth conductive connections 248, fifth conductive connections 249, sixth conductive connections 244, and seventh conductive connections 247 may be provided in the encapsulant 59. The memory chips 11, 12, 13, and 14, the first buffer chip 261, and the logic chip 7 may include a plurality of data pads 91 and a plurality of power pads 92.

The first redistribution patterns (reference number 275 of FIG. 8) and the second redistribution pads (reference number 292 of FIG. 8) may be omitted. The fifth conductive connections 249 may be in contact with the first redistribution pads 291 and the data pads 91 of the logic chip 7.

Figure 12:
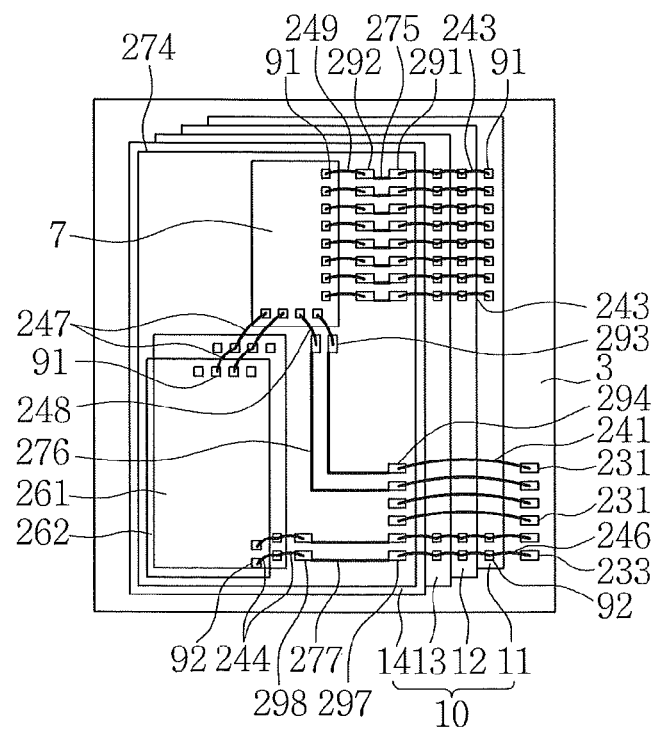
Figure 13:
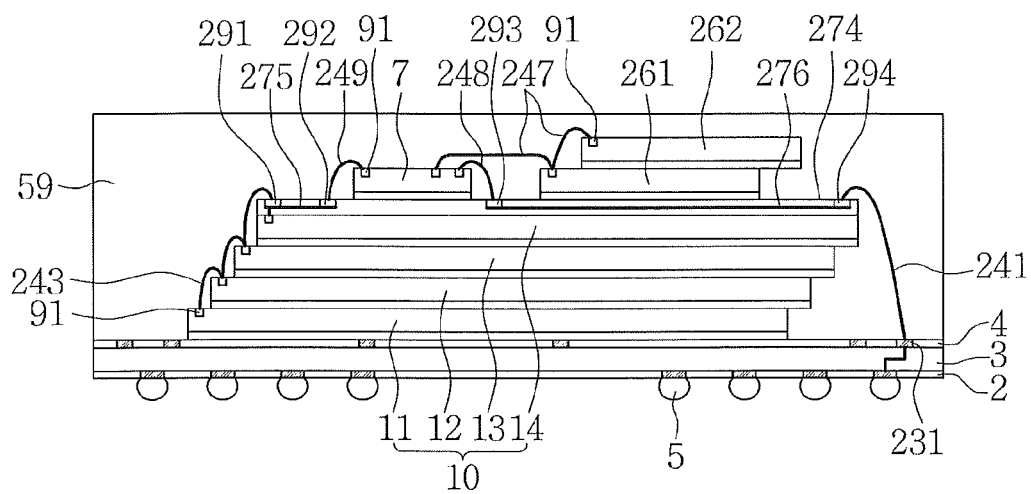
Figure 14:
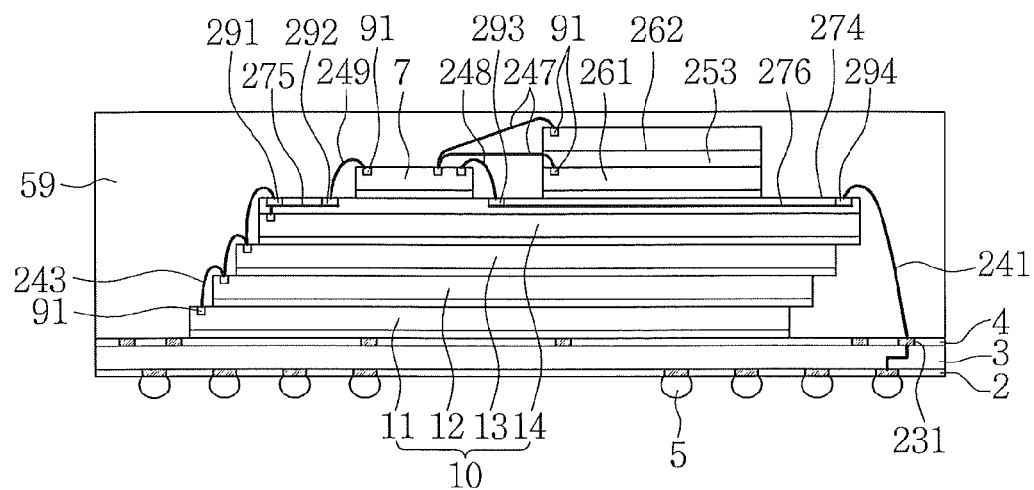

FIG. 12 is a layout for describing a semiconductor package in accordance with some embodiments of the inventive concept, and FIGS. 13 and 14 are cross-sectional views for describing a semiconductor package in accordance with some embodiments of the inventive concept.

Referring to FIGS. 12 and 13, a first chip stack 10 may be mounted on a board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of third redistribution patterns 277, a plurality of first redistribution pads 291, a plurality of second redistribution pads 292, a plurality of third redistribution pads 293, a plurality of fourth redistribution pads 294, a plurality of fifth redistribution pads 297, and a plurality of sixth redistribution pads 298 may be formed in the redistribution layer 274. A logic chip 7, a first buffer chip 261, and a second buffer chip 262 may be mounted on the redistribution layer 274. The second buffer chip 262 may be offset-aligned on the first buffer chip 261. An encapsulant 59 covering the first chip stack 10, the logic chip 7, the first buffer chip 261, and the second buffer chip 262 may be formed on the board 3. First conductive connections 241, second conductive connections 243, third conductive connections 246, fourth conductive connections 248, fifth conductive connections 249, sixth conductive connections 244, and seventh conductive connections 247 may be provided in the encapsulant 59. The memory chips 11, 12, 13, and 14, the first buffer chip 261, the second buffer chip 262, and the logic chip 7 may include a plurality of data pads 91 and a plurality of power pads 92.

The first buffer chip 261 and the second buffer chip 262 may be connected to the logic chip 7 using the seventh conductive connection 247. The third redistribution patterns 277 may be formed between the fifth redistribution pads 297 and the sixth redistribution pads 298. The sixth conductive connections 244 may be formed between the power pads 92 of the first buffer chip 261 and second buffer chip 262 and the sixth redistribution pads 298. The first buffer chip 261 and the second buffer chip 262 may include a volatile memory device such as a DRAM or an SRAM.

Referring to FIG. 14, the second buffer chip 262 may be mounted on the first buffer chip 261 using a first adhesive layer 253. The first buffer chip 261 and the second buffer chip 262 may be connected to the logic chip 7 using the seventh conductive connections 247. The seventh conductive connections 247 may pass through the inside of the first adhesive layer 253.

The first adhesive layer 253 may be referred to as a direct adhesive film (DAF) or a film over wire (FOW). For example, when the seventh conductive connections 247 are a bonding wire, a part of the bonding wire may partially penetrate or pass through the first adhesive layer 253. When the seventh conductive connections 247 penetrate or pass through the first adhesive layer 253, the second buffer chip 262 may be vertically aligned on the first buffer chip 261.

Figure 15:
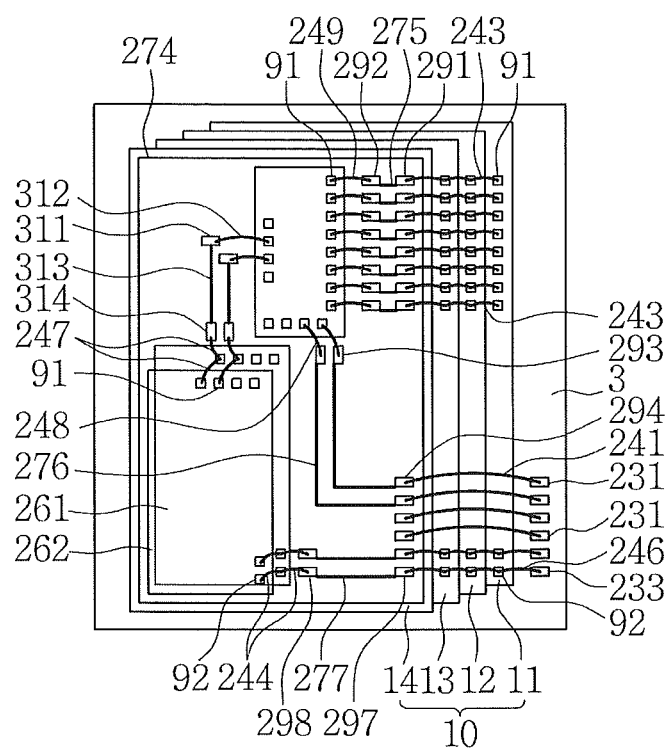

FIG. 15 is a layout for describing a semiconductor package in accordance with some embodiments of the inventive concept.

Referring to FIG. 15, a first chip stack 10 may be mounted on a board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of third redistribution patterns 277, a plurality of fourth redistribution patterns 313, a plurality of first redistribution pads 291, a plurality of second redistribution pads 292, a plurality of third redistribution pads 293, a plurality of fourth redistribution pads 294, a plurality of fifth redistribution pads 297, a plurality of sixth redistribution pads 298, a plurality of seventh redistribution pads 311, and a plurality of eighth redistribution pads 314 may be formed in the redistribution layer 274. A logic chip 7, a first buffer chip 261, and a second buffer chip 262 may be mounted on the redistribution layer 274. The second buffer chip 262 may be offset-aligned on the first buffer chip 261. An encapsulant 59 covering the first chip stack 10, the logic chip 7, the first buffer chip 261, and the second buffer chip 262 may be formed on the board 3. First conductive connections 241, second conductive connections 243, third conductive connections 246, fourth conductive connections 248, fifth conductive connections 249, sixth conductive connections 244, seventh conductive connections 247, and eighth conductive connections 312 may be provided in the encapsulant 59.

The seventh redistribution pads 311 and the eighth redistribution pads 314 may be formed at both ends of the fourth redistribution patterns 313. The fourth redistribution patterns 313, the seventh redistribution pads 311, and the eighth redistribution pads 314 may be formed between the first buffer chip 261 and the logic chip 7. The first buffer chip 261 and the second buffer chip 262 may be connected to the eighth redistribution pads 314 using the seventh conductive connections 247. The logic chip 7 may be connected to the seventh redistribution pads 311 using the eighth conductive connections 312.

FIGS. 16 to 21 are cross-sectional views for describing a semiconductor package in accordance with some embodiments of the inventive concept.

Figure 16:
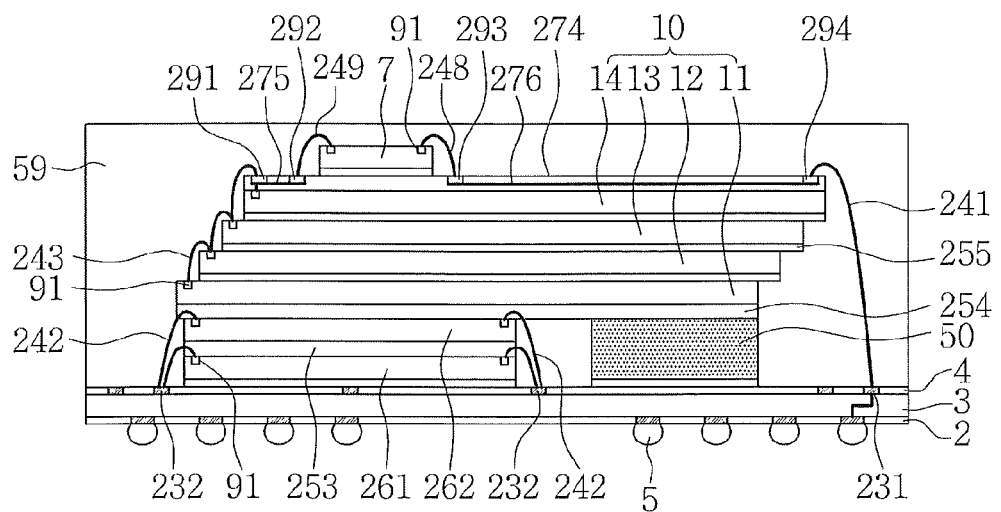
Figure 17:
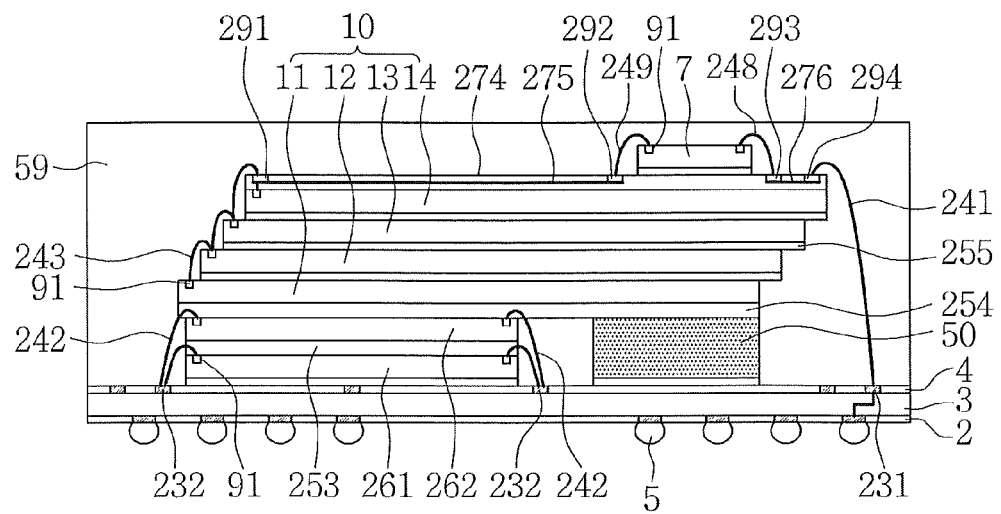

Referring to FIGS. 16 and 17, buffer chips 261 and 262 and a support 50 may be mounted on a board 3. A first chip stack 10 may be mounted on the buffer chips 261 and 262 and the support 50. The first chip stack 10 may include a plurality of memory chips 11, 12, 13, and 14. A redistribution layer 274 may be formed on the uppermost memory chip 14 among the plurality of memory chips 11, 12, 13, and 14. A first redistribution pattern 275, a second redistribution pattern 276, and first to fourth redistribution pads 291, 292, 293, and 294 may be formed in the redistribution layer 274. A logic chip 7 may be mounted on the redistribution layer 274. An encapsulant 59 covering the buffer chips 261 and 262, the support 50, the first chip stack 10, and the logic chip 7 may be formed on the board 3. In addition, first conductive connections 241, second conductive connections 243, fourth conductive connections 248, fifth conductive connections 249, and ninth conductive connections 242 may be formed in the encapsulant 59. The buffer chips 261 and 262, the memory chips 11, 12, 13, and 14, and the logic chip 7 may include data pads 91. Each of the conductive connections 241, 242, 243, 248, and 249 may include a bonding wire, a beam lead, a conductive tape, a conductive spacer, a through-electrode, a solder ball, a solder bump, or a combination thereof.

The board 3 may include a rigid printed circuit board, a flexible printed circuit board, or a rigid-flexible printed circuit board. A bottom surface of the board 3 may be covered with a lower solder resist 2, and a top surface of the board 3 may be covered with an upper solder resist 4. First electrode fingers 231 and third electrode fingers 232 may be formed on the board 3. External terminals 5 passing through the lower solder resist 2 may be formed under the board 3. The first electrode fingers 231 may be electrically connected to one selected from the external terminals 5 through the board 3. The external terminals 5 may include a solder ball, a solder bump, a pin grid array, a lead grid array, a conductive tab, or a combination thereof.

In some embodiments, the board 3, the buffer chips 261 and 262, the support 50, the first chip stack 10, the logic chip 7, and the encapsulant 59 may configure a card-type package. The external terminals 5 may be omitted.

Each of the buffer chips 261 and 262 may include a volatile memory device such as a DRAM or an SRAM. The data pads 91 of the buffer chips 261 and 262 may be a data input/output pad. The ninth conductive connections 242 may be formed between the data pads 91 of the buffer chips 261 and 262 and the third electrode fingers 232.

The buffer chips 261 and 262 may be electrically connected to the logic chip 7 via the ninth conductive connections 242 and the board 3. The buffer chips 261 and 262 may include a first buffer chip 261 and a second buffer chip 262. The second buffer chip 262 may be mounted on the first buffer chip 261 using a first adhesive layer 253. The first adhesive layer 253 may be referred to as a DAF or an FOW. The ninth conductive connections 242 may pass through the inside of the first adhesive layer 253. For example, when the ninth conductive connections 242 are a bonding wire, a part of the bonding wire may partially penetrate or pass through the first adhesive layer 253. When the ninth conductive connections 242 penetrate or pass through the first adhesive layer 253, the second buffer chip 262 may be vertically aligned on the first buffer chip 261. Top surfaces of the support 50 and the second buffer chip 262 may be at the same horizontal level.

Each of the memory chips 11, 12, 13, and 14 may include a non-volatile memory device such as a NAND flash memory. The data pads 91 of the memory chips 11, 12, 13, and 14 may be a data input/output pad. The memory chips 11, 12, 13, and 14 may be stacked in a cascade structure. The memory chips 11, 12, 13, and 14 may be offset-aligned step by step. Each of the memory chips 11, 12, 13, and 14 may have a greater width than the second buffer chip 262. The lowermost memory chip 11 among the memory chips 11, 12, 13, and 14 may be attached to the support 50 and the second buffer chip 262 using a second adhesive layer 254. A side of the lowermost memory chip 11 may be vertically aligned with a side of the support 50. Another side of the lowermost memory chip 11 may be aligned on the second buffer chip 262. A third adhesive layer 255 may be formed between the memory chips 11, 12, 13, and 14. The memory chips 11, 12, 13, and 14 may be offset-aligned with a direction of the board 3 step by step.

The thickness of the second adhesive layer 254 may be greater than that of the third adhesive layer 255. The ninth conductive connections 242 may pass through the inside of the second adhesive layer 254. For example, when the ninth conductive connections 242 are a bonding wire, a part of the bonding wire may partially penetrate or pass through the second adhesive layer 254. When the ninth conductive connections 242 penetrate or pass through the second adhesive layer 254, the second buffer chip 262 and the support 50 may be mounted within the occupied area of the lowermost memory chip 11.

The second adhesive layer 254 may have the same width as the lowermost memory chip 11. The second adhesive layer 254 may be attached to a bottom surface of the lowermost memory chip 11. The second adhesive layer 254 may be in direct contact with the lowermost memory chip 11, the second buffer chip 262, and the support 50. The second adhesive layer 254 may be a DAF or an FOW. The third adhesive layer 255 may be the same kind of material layer as the second adhesive layer 254. In some embodiments, the third adhesive layer 255 may be a different kind of material layer from the second adhesive layer 254.

The first redistribution pattern 275 and the second redistribution pattern 276 may be spaced apart from each other. The first and second redistribution pads 291 and 292 in contact with both ends of the first redistribution pattern 275 may be formed. The third and fourth redistribution pads 293 and 294 in contact with both ends of the second redistribution pattern 276 may be formed. The first redistribution pad 291 may be in contact with or electrically connected to the data pad 91 of the uppermost memory chip 14. In addition, the first redistribution pad 291 may be electrically connected to the plurality of memory chips 11, 12, and 13 via the second conductive connections 243. The second conductive connections 243 may be in contact with the data pads 91 of the memory chips 11, 12, and 13, and the first redistribution pad 291.

The logic chip 7 may be a controller or a microprocessor. The logic chip 7 may have a smaller width than the memory chips 11, 12, and 13. The logic chip 7 may be mounted on the redistribution layer 274. One selected from the data pads 91 of the logic chip 7 may be connected to the second redistribution pad 292 via the fifth conductive connection 249. Another one selected from the data pads 91 of the logic chip 7 may be connected to the third redistribution pad 293 via the fourth conductive connection 248. The first conductive connection 241 may be formed between the fourth redistribution pad 294 and the first electrode fingers 231.

The memory chips 11, 12, and 13 may be electrically connected to the board 3 via the data pads 91, the second conductive connections 243, the first redistribution pad 291, the first redistribution pattern 275, the second redistribution pad 292, the fifth conductive connection 249, the logic chip 7, the fourth conductive connection 248, the third redistribution pad 293, the second redistribution pattern 276, the fourth redistribution pad 294, and the first conductive connection 241, sequentially.

As shown in FIGS. 16 and 17, lengths of the first redistribution pattern 275 and the second redistribution pattern 276 may be freely adjusted depending on a position of the logic chip 7. For example, when a signal transfer path between the logic chip 7 and the memory chips 11, 12, and 13 is required to be reduced, the length of the first redistribution pattern 275 may be reduced to be shorter than that of the second redistribution pattern 276, as similar to FIG. 16. The electrical connection path between the data pads 91 of the memory chips 11, 12, and 13 and the logic chip 7 may be reduced to be shorter than that between the logic chip 7 and the board 3.

The second buffer chip 262 may be vertically aligned on the first buffer chip 261 using a configuration in which the ninth conductive connections 242 pass through the first adhesive layer 253. In addition, the second buffer chip 262 and the support 50 may be mounted within the occupied area of the lowermost memory chip 11 using a configuration in which the ninth conductive connections 242 pass through the second adhesive layer 254.

The first and the second buffer chip 261 and 262 may overlap with the lowermost memory chip 11 but may not overlap with the support 50.

Figure 18:
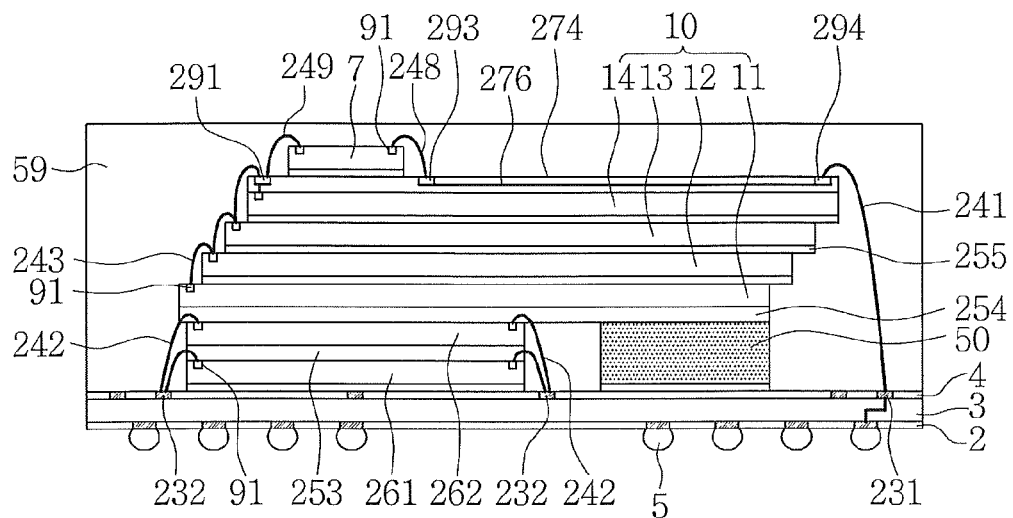

Referring to FIG. 18, a redistribution layer 274 may be formed on the uppermost memory chip 14 among the memory chips 11, 12, 13, and 14. The first redistribution pad 291, the second redistribution pattern 276, and the third and fourth redistribution pads 293 and 294 located at both ends of the second redistribution pattern 276 may be formed in the redistribution layer 274. A logic chip 7 may be mounted on the redistribution layer 274. One selected from the data pads 91 of the logic chip 7 may be connected to the first redistribution pad 291 via the fifth conductive connection 249. Another one selected from the data pads 91 of the logic chip 7 may be connected to the third redistribution pad 293 via the fourth conductive connection 248. The first redistribution pattern (reference number 275 of FIG. 16) and the second redistribution pad (reference number 292 of FIG. 16) may be omitted.

The logic chip 7 may be mounted close to the first redistribution pad 291 and the data pads 91 of the memory chips 11, 12, 13, and 14.

Figure 19:
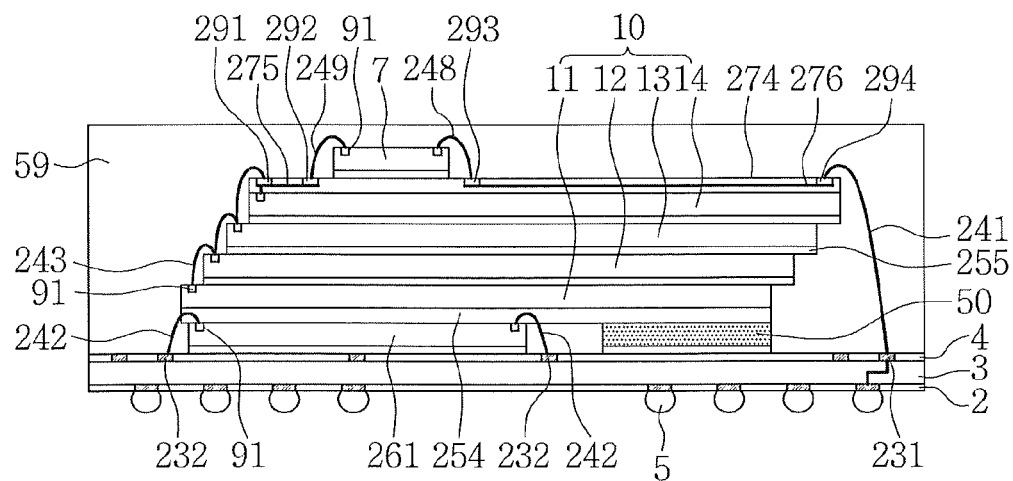

Referring to FIG. 19, the second buffer chip (reference number 262 of FIG. 16) may be omitted. Top surfaces of the support 50 and the first buffer chip 261 may be at the same horizontal level. The lowermost memory chip 11 among the memory chips 11, 12, 13, and 14 may be attached to the support 50 and the first buffer chip 261 using a second adhesive layer 254. A side of the lowermost memory chip 11 may be aligned on the first buffer chip 261. The ninth conductive connections 242 may pass through the inside of the second adhesive layer 254. The first buffer chip 261 and the support 50 may be mounted within the occupied area of the lowermost memory chip 11.

Figure 20:
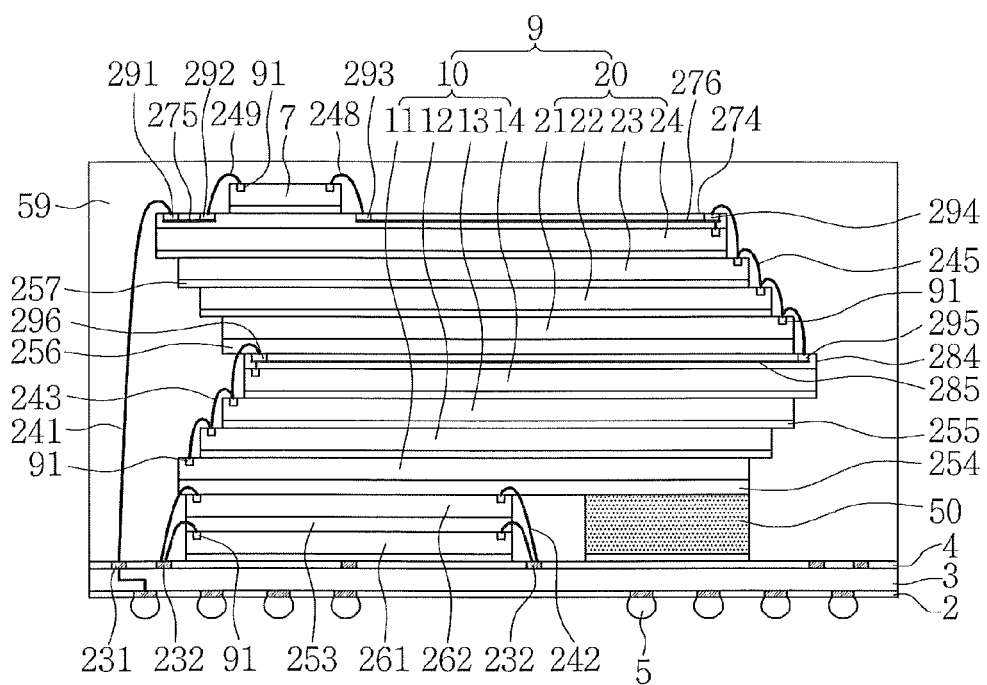

Referring to FIG. 20, a chip stack 9 may be mounted on the buffer chips 261 and 262 and the support 50. The chip stack 9 may include a plurality of memory chips 11, 12, 13, 14, 21, 22, 23, and 24. For convenience, the plurality of memory chips 11, 12, 13, 14, 21, 22, 23, and 24 may be referred to as first to eighth memory chips 11, 12, 13, 14, 21, 22, 23, and 24. The first to fourth memory chips 11, 12, 13, and 14 may configure a first chip stack 10, and the fifth to eighth memory chips 21, 22, 23, and 24 may configure a second chip stack 20. A redistribution layer 274 may be formed on the eighth memory chip 24.

An intermediate redistribution layer 284 may be formed on the fourth memory chip 14. The intermediate redistribution layer 284 may include a fifth redistribution pattern 285 and a ninth redistribution pad 295 and tenth redistribution pad 296 formed at both ends of the fifth redistribution pattern 285. The first to fourth memory chips 11, 12, 13, and 14 may be stacked in a first cascade structure. The second conductive connections 243 may be in contact with the tenth redistribution pad 296.

The fifth to eighth memory chips 21, 22, 23, and 24 may be stacked in a second cascade structure. The fifth to eighth memory chips 21, 22, 23, and 24 may be aligned in a different direction from the first to fourth memory chips 11, 12, 13, and 14. The fifth to eighth memory chips 21, 22, 23, and 24 may be sequentially offset-aligned in an opposite direction from the first to fourth memory chips 11, 12, 13, and 14. For example, the fifth memory chip 21 may be attached on the intermediate redistribution layer 284 using a fourth adhesive layer 256. The fourth adhesive layer 256 may be the same as the second adhesive layer 254. The second conductive connections 243 may pass through the inside of the fourth adhesive layer 256.

The sixth to eighth memory chips 22, 23, and 24 may be sequentially attached to the fifth memory chip 21 using a fifth adhesive layer 257. The fifth to seventh memory chips 21, 22, and 23 may be connected to the fourth redistribution pad 294 using tenth conductive connections 245. The data pad 91 of the eighth memory chip 24 may be in contact with or electrically connected to the fourth redistribution pad 294. An end of the tenth conductive connections 245 may be in contact with the ninth redistribution pad 295.

Figure 21:
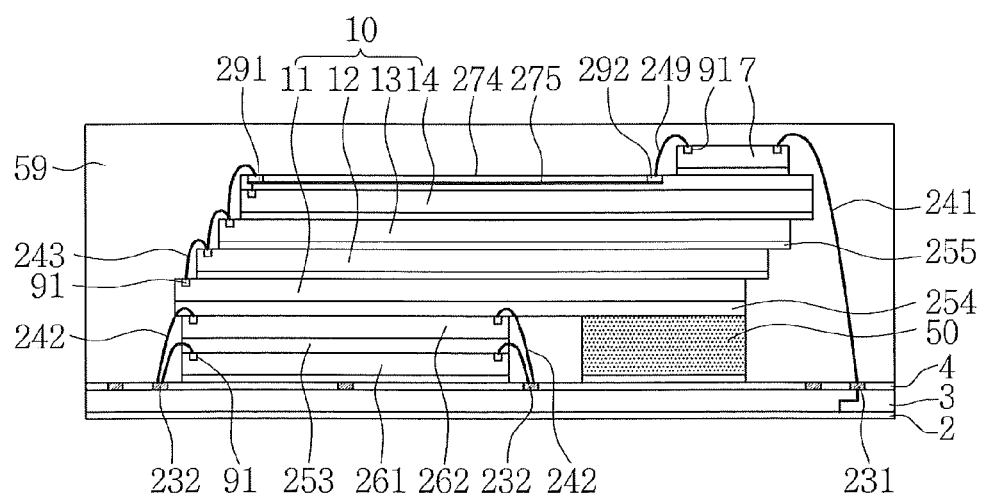

Referring to FIG. 21, a redistribution layer 274 may be formed on the uppermost memory chip 14 among the memory chips 11, 12, 13, and 14. The first redistribution pattern 275 and first and second redistribution pads 291 and 292 located at both ends of the first redistribution pattern 275 may be formed in the redistribution layer 274. A logic chip 7 may be mounted on the redistribution layer 274. One selected from the data pads 91 of the logic chip 7 may be connected to the second redistribution pad 292 via the fifth conductive connection 249. Another one selected from the data pads 91 of the logic chip 7 may be connected to a first electrode finger 231 via a first conductive connection 241. The second redistribution pattern (reference number 276 of FIG. 17), and the third and fourth redistribution pads (reference numbers 293 and 294 of FIG. 16) may be omitted.

Figure 22A:
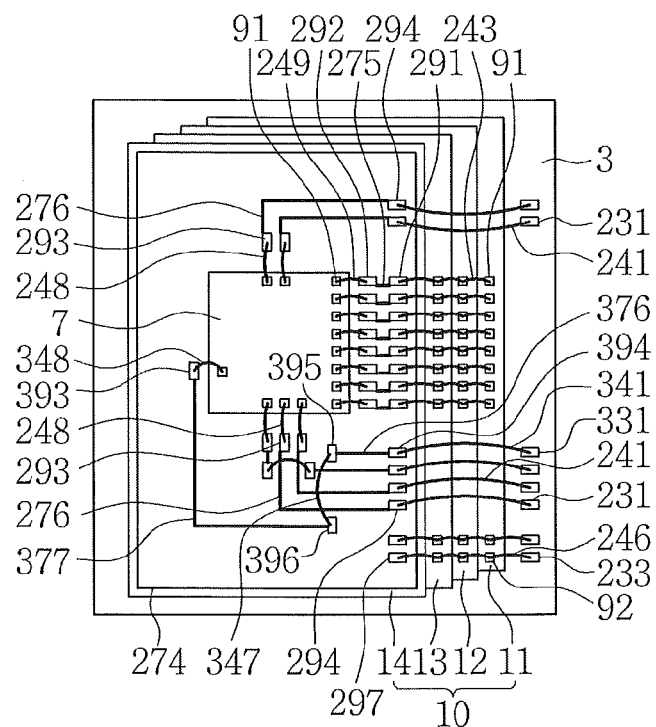
Figure 22B:
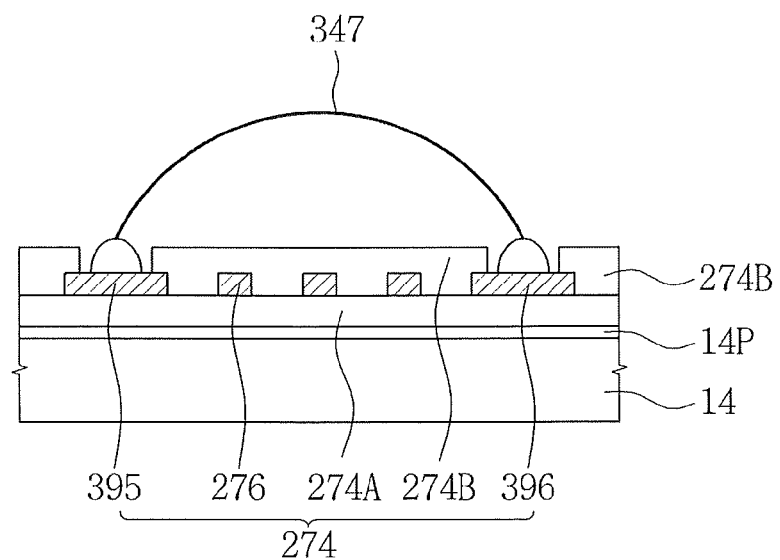
FIG. 22B is a cross-sectional view showing a part of FIG. 22A.

FIG. 22A is a layout for describing a semiconductor package in accordance with some embodiments of the inventive concept, and FIG. 22B is a cross-sectional view showing a part of FIG. 22A.

Referring to FIG. 22A, a first chip stack 10 may be mounted on the board 3. The first chip stack 10 may include a plurality of memory chips 11, 12, 13, and 14. A redistribution layer 274 may be formed on the uppermost memory chip 14 among the memory chips 11, 12, 13, and 14. A plurality of first redistribution patterns 275, a plurality of second redistribution patterns 276, a plurality of first redistribution pads 291, a plurality of second redistribution pads 292, a plurality of third redistribution pads 293, a plurality of fourth redistribution pads 294, a plurality of fifth redistribution pads 297, a plurality of sixth redistribution patterns 376, a plurality of seventh redistribution patterns 377, a plurality of eleventh redistribution pads 393, a plurality of twelfth redistribution pads 394, a plurality of thirteenth redistribution pads 395, and a plurality of fourteenth redistribution pads 396 may be formed in the redistribution layer 274. A logic chip 7 may be mounted on the redistribution layer 274. First to fifth conductive connections 241, 243, 246, 248, and 249 and eleventh to thirteenth conductive connections 341, 347, and 348 may be provided on the board 3. The plurality of memory chips 11, 12, 13, and 14 and the logic chip 7 may include a plurality of data pads 91 and a plurality of power pads 92.

The thirteenth conductive connections 348 may be connected between the logic chip 7 and the eleventh redistribution pads 393. The seventh redistribution patterns 377 may be formed between the eleventh redistribution pads 393 and the fourteenth redistribution pads 396. The twelfth conductive connections 347 may be connected to the fourteenth redistribution pads 396 and the thirteenth redistribution pads 396. The sixth redistribution patterns 376 may be formed between the thirteenth redistribution pads 396 and the twelfth redistribution pads 394. The eleventh conductive connections 341 may be connected to the twelfth redistribution pads 394 and a fourth electrode finger 331.

The twelfth conductive connections 347 may include a bonding wire, a beam lead, or a conductive tape. For example, the twelfth conductive connections 347 may be a bonding wire such as a gold wire or an aluminum wire. The second redistribution patterns 276 may be arranged between the fourteenth redistribution pads 396 and the thirteenth redistribution pads 396. The twelfth conductive connections 347 may cross over the second redistribution patterns 276. The twelfth conductive connections 347 may be spaced apart from the second redistribution patterns 276.

In some embodiments, at least one of the first redistribution patterns 275 and second redistribution patterns 276 may be formed between the fourteenth redistribution pads 396 and the thirteenth redistribution pads 396.

Referring to FIG. 22B, the uppermost memory chip 14 may include a passivation insulating layer 14P. The passivation insulating layer 14P may cover the uppermost memory chip 14. The redistribution layer 274 may include a first insulating layer 274A, the thirteenth redistribution pads 396, the second redistribution patterns 276, the fourteenth redistribution pads 396, and a second insulating layer 274B. The first insulating layer 274A may cover the uppermost memory chip 14. The thirteenth redistribution pads 396, the second redistribution patterns 276, and the fourteenth redistribution pads 396 may be formed on the first insulating layer 274A. For example, the thirteenth redistribution pads 396, the second redistribution patterns 276, and the fourteenth redistribution pads 396 may be formed at the same level. The thirteenth redistribution pads 396, the second redistribution patterns 276, and the fourteenth redistribution pads 396 may be formed not to overlap each other.

The second insulating layer 274B may cover the first insulating layer 274A and the second redistribution patterns 276, and expose the thirteenth redistribution pads 396 and expose the fourteenth redistribution pads 396. The twelfth conductive connections 347 may be formed between the thirteenth redistribution pads 396 and the fourteenth redistribution pads 396. The twelfth conductive connections 347 may be spaced apart from the second redistribution patterns 276. The twelfth conductive connections 347 may be in direct contact with the thirteenth redistribution pads 396 and the fourteenth redistribution pads 396.

Figure 23:
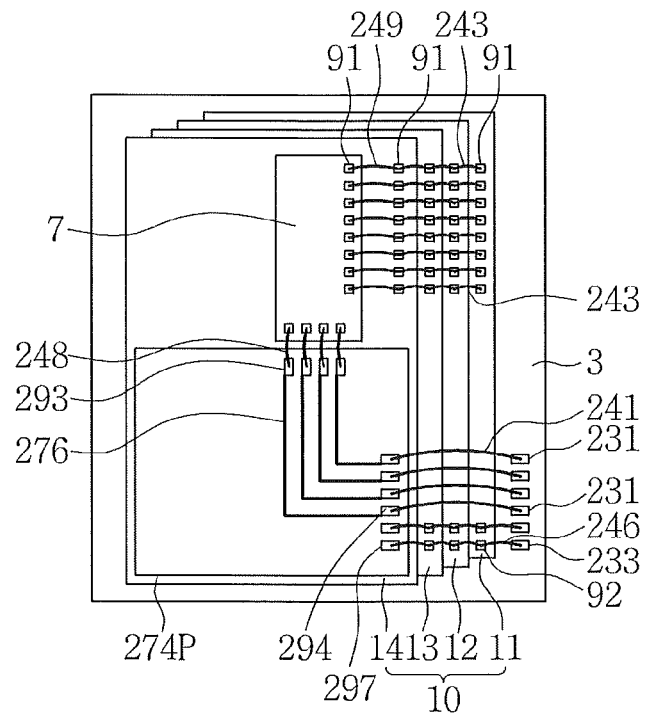
Figure 24:
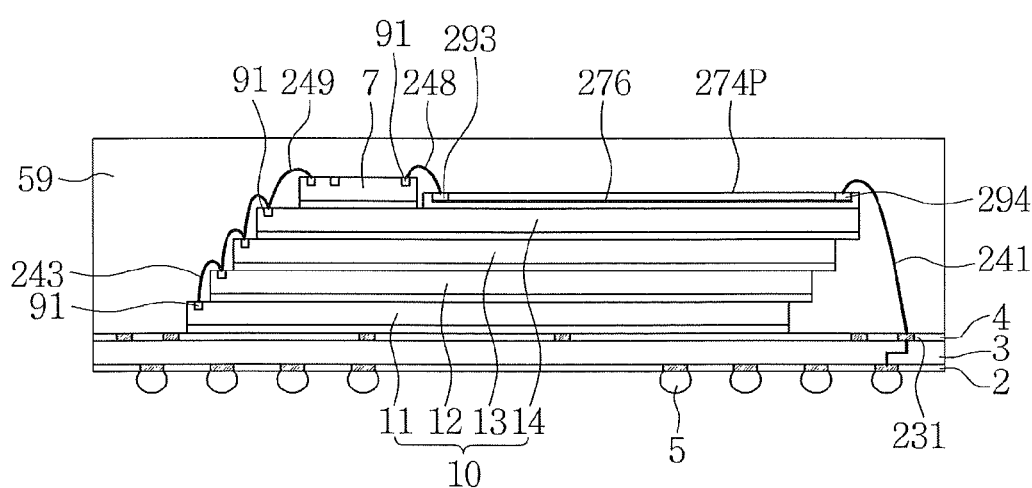

FIG. 23 is a layout for describing a semiconductor package in accordance with some embodiments of the inventive concept, and FIG. 24 is a cross-sectional view for describing a semiconductor package in accordance with some embodiments of the inventive concept.

Referring to FIGS. 23 and 24, a first chip stack 10 may be mounted on the board 3. The first chip stack 10 may include a plurality of memory chips 11, 12, 13, and 14. A redistribution layer 274P may be formed on the uppermost memory chip 14 among the plurality of memory chips 11, 12, 13, and 14. The redistribution layer 274P may partially cover the uppermost memory chip 14 and may not overlap with the logic chip 7.

A plurality of second redistribution patterns 276, a plurality of third redistribution pads 293, a plurality of fourth redistribution pads 294, and a plurality of fifth redistribution pads 297 may be formed in the redistribution layer 274P. A logic chip 7 may be mounted on the uppermost memory chip 14. An encapsulant 59 covering the first chip stack 10 and the logic chip 7 may be provided on the board 3. First to fifth conductive connections 241, 243, 246, 248, and 249 may be formed in the encapsulant 59. The plurality of memory chips 11, 12, 13, and 14 and the logic chip 7 may include a plurality of data pads 91 and a plurality of power pads 92.

The redistribution layer 274P may not be disposed between the logic chip 7 and the uppermost memory chip 14. For example, the redistribution layer 274P may be partially formed on the uppermost memory chip 14 in order not to overlap the logic chip 7. The first redistribution pads (reference number 291 of FIG. 5) may be omitted. The fifth conductive connections 249 may be in contact with the data pads 91 of the uppermost memory chip 14, and the data pads 91 of the logic chip 7.

Figure 25:
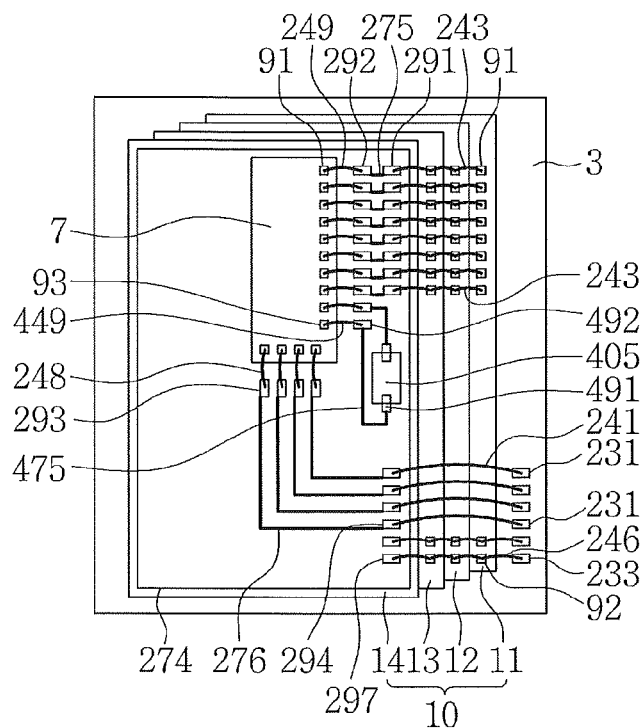
Figure 26:
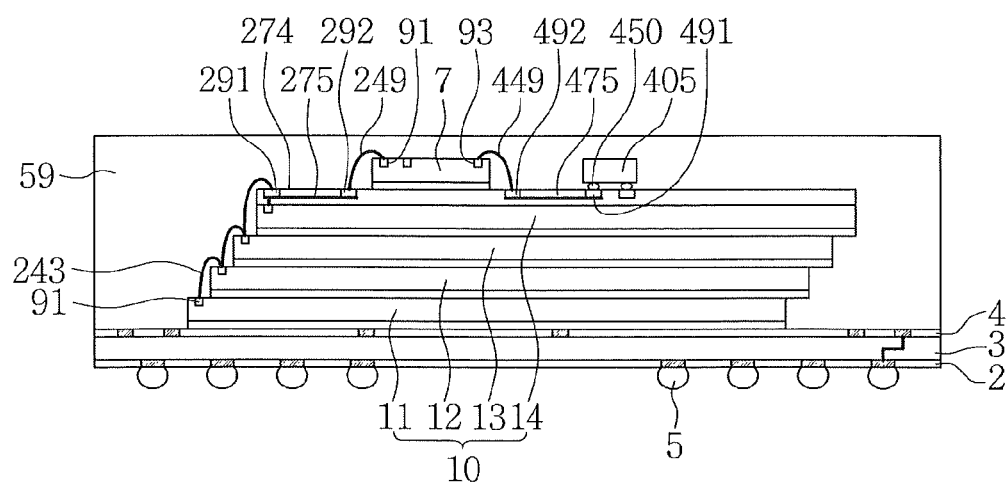

FIG. 25 is a layout for describing a semiconductor package in accordance with some embodiments of the inventive concept, and FIG. 26 is a cross-sectional view for describing a semiconductor package in accordance with some embodiments of the inventive concept.

Referring to FIGS. 25 and 26, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of eighth redistribution patterns 475, a plurality of first redistribution pads 291, a plurality of second redistribution pads 292, a plurality of third redistribution pads 293, a plurality of fourth redistribution pads 294, a plurality of fifth redistribution pads 297, a plurality of fifteenth redistribution pads 491, and a plurality of sixteenth redistribution pads 492 may be formed in the redistribution layer 274. A logic chip 7 and a first decoupling capacitor 405 may be mounted on the redistribution layer 274. An encapsulant 59 covering the first chip stack 10 and the logic chip 7 may be provided on the board 3. First to fifth conductive connections 241, 243, 246, 248, and 249, fourteenth conductive connections 449, and fifteenth conductive connections 450 may be provided in the encapsulant 59. The plurality of memory chips 11, 12, 13, and 14 and the logic chip 7 may include a plurality of first data pads 91, a plurality of second data pads 93, and a plurality of power pads 92.

The fourteenth conductive connections 449 may be a bonding wire. The fifteenth conductive connections 450 may be a conductive paste, a solder ball, or a solder bump. Each of the plurality of memory chips 11, 12, 13, and 14 may include a non-volatile memory device such as a NAND flash memory. Each of the plurality of memory chips 11, 12, 13, and 14 may have a greater width than the logic chip 7 and the first decoupling capacitor 405. For example, the first decoupling capacitor 405 may be a multi-layer ceramic capacitor (MLCC). The logic chip 7 may be a controller or microprocessor which includes a logic device.

A redistribution layer 274 may be interposed between the first decoupling capacitor 405 and the uppermost memory chip 14. The first decoupling capacitor 405 may be connected to the logic chip 7 via the fifteenth conductive connections 450, the plurality of fifteenth redistribution pads 491, the plurality of eighth redistribution patterns 475, the plurality of sixteenth redistribution pads 492, the fourteenth conductive connections 449, and the second data pads 93. The first decoupling capacitor 405 may be mounted close to the logic chip 7.

In some embodiments, the first decoupling capacitor 405 may be directly connected to the first data pads 91 of the uppermost memory chip 14. In some embodiments, the first decoupling capacitor 405 may be connected to two selected from the plurality of first data pads 91, the plurality of second data pads 93, and the plurality of power pads 92. In some embodiments, the first decoupling capacitor 405 may be connected to the plurality of power pads 92. In some embodiments, the first decoupling capacitor 405 may be connected to a data transfer path between the uppermost memory chip 14 and the logic chip 7. In some embodiments, each of the memory chips 11, 12, 13, and 14 may include a volatile memory device such as a DRAM. In some embodiments, the redistribution layer 274 may be referred to as an upper wiring layer.

Figure 27:
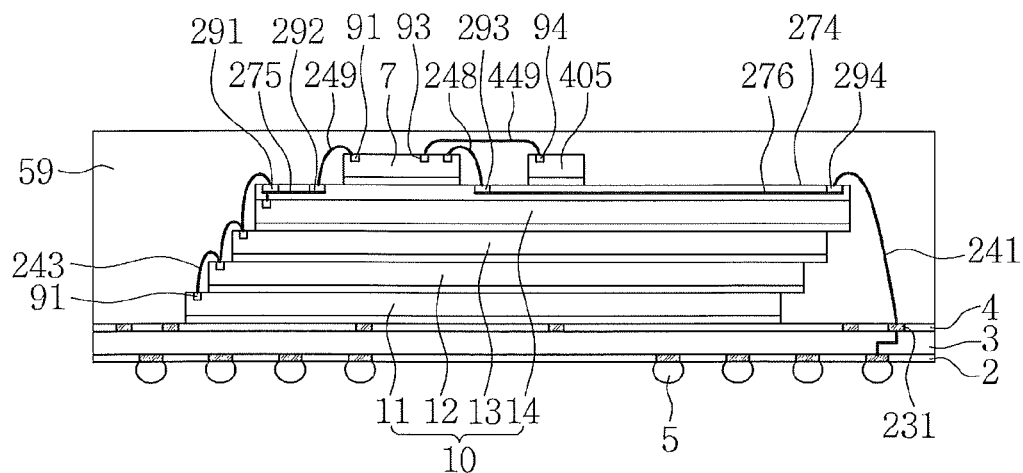

FIG. 27 is a cross-sectional view for describing a semiconductor package in accordance with some embodiments of the inventive concept.

Referring to FIG. 27, a redistribution layer 274 may be formed on the uppermost memory chip 14 among a plurality of memory chips 11, 12, 13, and 14. A logic chip 7 and a first decoupling capacitor 405 may be mounted on the redistribution layer 274. The first decoupling capacitor 405 may include a third data pad 94. A fourteenth conductive connection 449 may be formed between the third data pad 94 and a second data pad 93. The fourteenth conductive connection 449 may be a bonding wire. The first decoupling capacitor 405 may be connected to the logic chip 7 via the fourteenth conductive connection 449.

Figure 28:
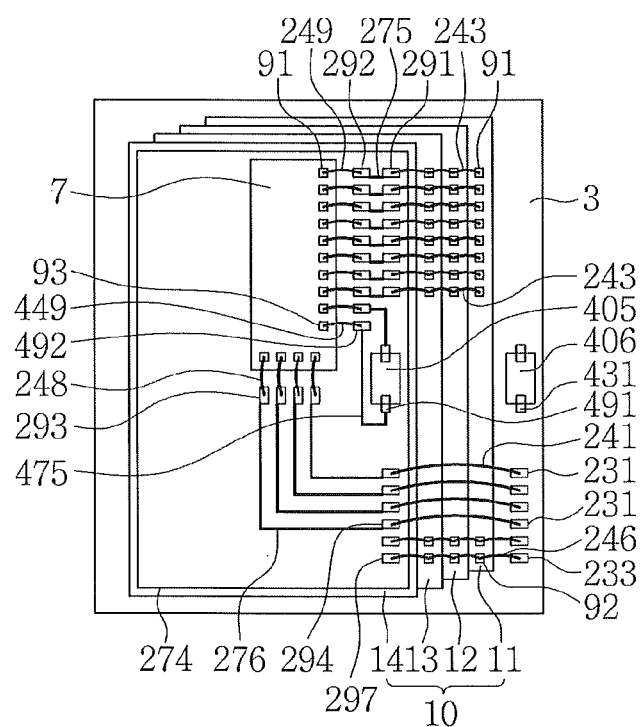

FIG. 28 is a layout for describing a semiconductor package in accordance with some embodiments of the inventive concept.

Referring to FIG. 28, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of eighth redistribution patterns 475, a plurality of first redistribution pads 291, a plurality of second redistribution pads 292, a plurality of third redistribution pads 293, a plurality of fourth redistribution pads 294, a plurality of fifth redistribution pads 297, a plurality of fifteenth redistribution pads 491, and a plurality of sixteenth redistribution pads 492 may be formed in the redistribution layer 274. A logic chip 7 and a first decoupling capacitor 405 may be mounted on the redistribution layer 274. First to fifth conductive connections 241, 243, 246, 248, and 249, fourteenth conductive connections 449, and fifteenth conductive connections 450 may be formed on the board 3. The plurality of memory chips 11, 12, 13, and 14 and the logic chip 7 may include a plurality of first data pads 91, second data pads 93, and a plurality of power pads 92.

A second decoupling capacitor 406 may be mounted on the board 3. The second decoupling capacitor 406 may be an MLCC. First electrode fingers 231, second electrode fingers 233, and fifth electrode fingers 431 may be formed on the board 3. The second decoupling capacitor 406 may be connected to the logic chip 7 or the plurality of memory chips 11, 12, 13, and 14 via the fifth electrode fingers 431.

Figure 29:
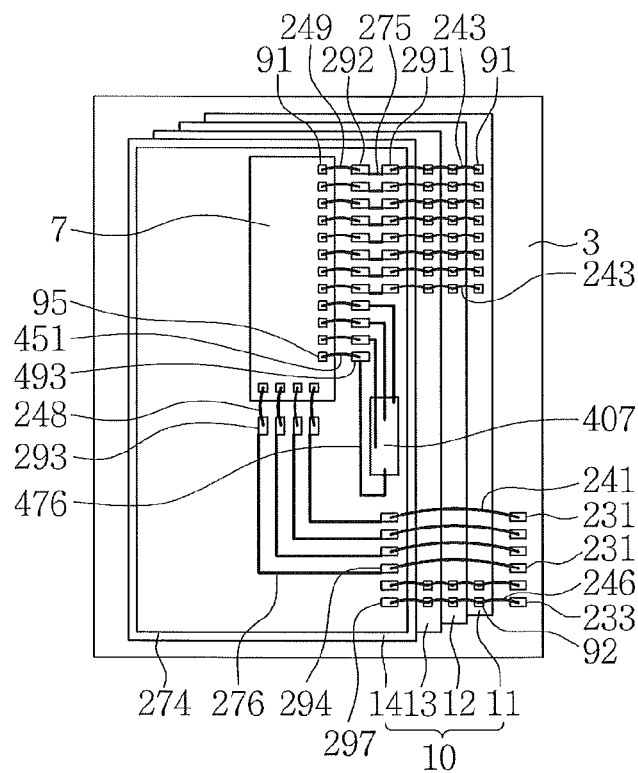
Figure 30:
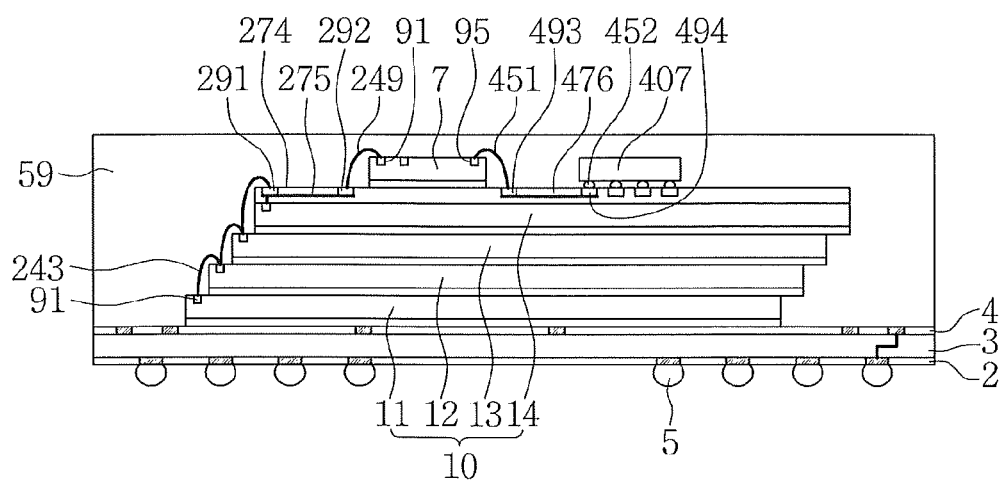

FIG. 29 is a layout for describing a semiconductor package in accordance with some embodiments of the inventive concept, and FIG. 30 is a cross-sectional view for describing a semiconductor package in accordance with some embodiments of the inventive concept.

Referring to FIGS. 29 and 30, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of ninth redistribution patterns 476, a plurality of first redistribution pads 291, a plurality of second redistribution pads 292, a plurality of third redistribution pads 293, a plurality of fourth redistribution pads 294, a plurality of fifth redistribution pads 297, a plurality of seventeenth redistribution pads 493, and a plurality of eighteenth redistribution pads 494 may be formed in the redistribution layer 274. A logic chip 7 and an IPD 407 may be mounted on the redistribution layer 274. An encapsulant 59 covering the first chip stack 10, the logic chip 7, and the IPD 407 may be provided on the board 3. First to fifth conductive connections 241, 243, 246, 248, and 249, sixteenth conductive connections 451, and seventeenth conductive connections 452 may be provided in the encapsulant 59. The plurality of memory chips 11, 12, 13, and 14 and the logic chip 7 may include a plurality of first data pads 91, fourth data pads 95, and a plurality of power pads 92.

The sixteenth conductive connections 451 may be a bonding wire. The seventeenth conductive connections 452 may be a solder ball or a solder bump. Each of the plurality of memory chips 11, 12, 13, and 14 may include a non-volatile memory device such as a NAND flash memory. Each of the plurality of memory chips 11, 12, 13, and 14 may have a greater width than the logic chip 7 and the IPD 407. The IPD 407 may include a resistor, an inductor, a capacitor, or a combination thereof. The logic chip 7 may be a controller or a microprocessor including a logic device.

The redistribution layer 274 may be interposed between the IPD 407 and the uppermost memory chip 14. The IPD 407 may be connected to the logic chip 7 via the seventeenth conductive connections 452, the plurality of eighteenth redistribution pads 494, the plurality of ninth redistribution patterns 476, the plurality of seventeenth redistribution pads 493, the sixteenth conductive connections 451, and the fourth data pads 95. The IPD 407 may be installed close to the logic chip 7.

In some embodiments, the IPD 407 may be directly connected to the first data pads 91 of the uppermost memory chip 14. In some embodiments, the IPD 407 may be connected to a data transfer path between the uppermost memory chip 14 and the logic chip 7. In some embodiments, each of the memory chips 11, 12, 13, and 14 may include a volatile memory device such as a DRAM.

Figure 31:
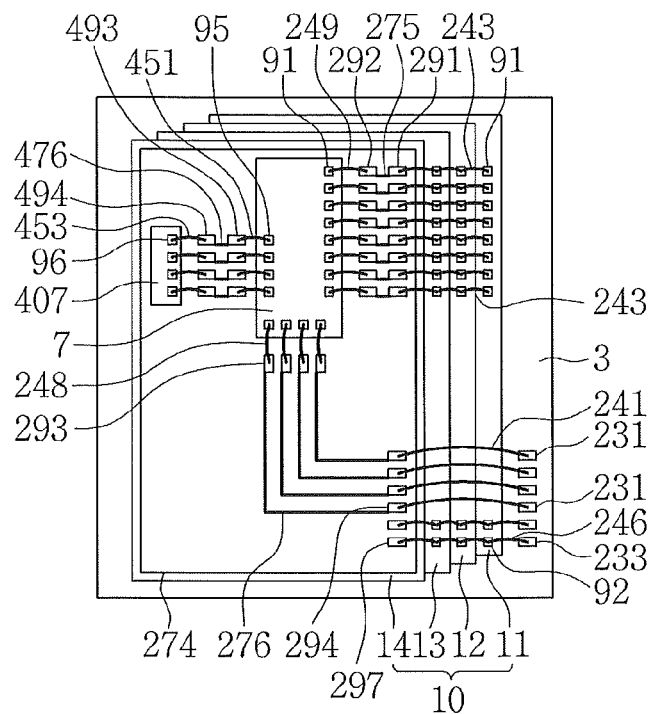
Figure 32:
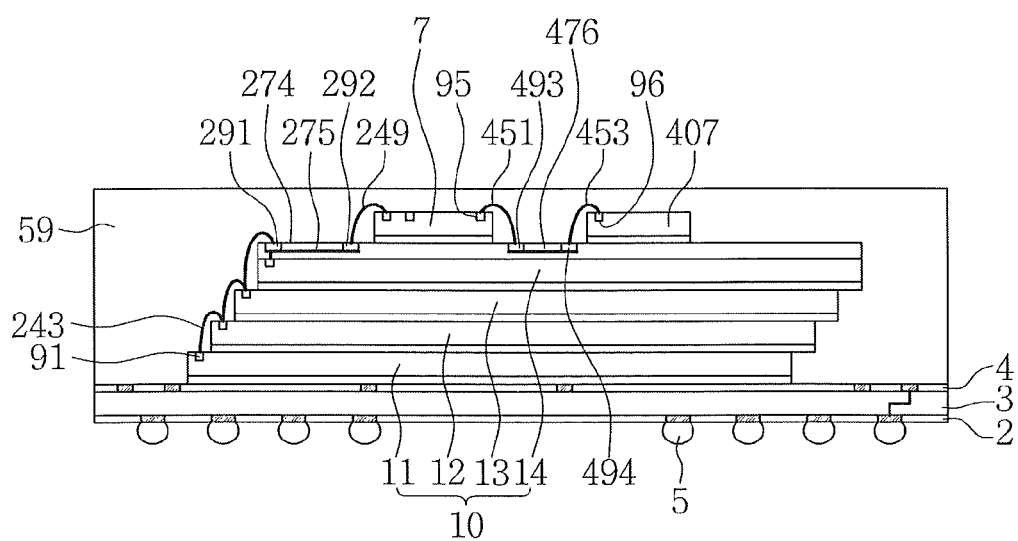

FIG. 31 is a layout for describing a semiconductor package in accordance with some embodiments of the inventive concept, and FIG. 32 is a cross-sectional view for describing a semiconductor package in accordance with some embodiments of the inventive concept.

Referring to FIGS. 31 and 32, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of ninth redistribution patterns 476, a plurality of first redistribution pads 291, a plurality of second redistribution pads 292, a plurality of third redistribution pads 293, a plurality of fourth redistribution pads 294, a plurality of fifth redistribution pads 297, a plurality of seventeenth redistribution pads 493, and a plurality of eighteenth redistribution pads 494 may be formed in the redistribution layer 274. A logic chip 7 and an IPD 407 may be mounted on the redistribution layer 274. An encapsulant 59 covering the first chip stack 10, the logic chip 7, and the IPD 407 may be formed on the board 3. First to fifth conductive connections 241, 243, 246, 248, and 249, sixteenth conductive connections 451, and eighteenth conductive connections 453 may be provided in the encapsulant 59. The plurality of memory chips 11, 12, 13, and 14 and the logic chip 7 may include a plurality of first data pads 91, fourth data pads 95, and a plurality of power pads 92.

The sixteenth conductive connections 451 and the eighteenth conductive connections 453 may be a bonding wire. Each of the plurality of memory chips 11, 12, 13, and 14 may include a non-volatile memory device such as a NAND flash memory. Each of the plurality of memory chips 11, 12, 13, and 14 may have a greater width than the logic chip 7 and the IPD 407. The IPD 407 may include a resistor, an inductor, a capacitor, or a combination thereof. The logic chip 7 may be a controller or microprocessor including a logic device.

The redistribution layer 274 may be interposed between the IPD 407 and the uppermost memory chip 14. The IPD 407 may include fifth data pads 96. The eighteenth conductive connections 453 may be formed between the fifth data pads 96 and the plurality of eighteenth redistribution pads 494. The IPD 407 may be connected to the logic chip 7 via the eighteenth conductive connections 453, the plurality of eighteenth redistribution pads 494, the plurality of ninth redistribution patterns 476, the plurality of seventeenth redistribution pads 493, the sixteenth conductive connections 451, and the fourth data pads 95. The IPD 407 may be installed close to the logic chip 7.

Figure 33:
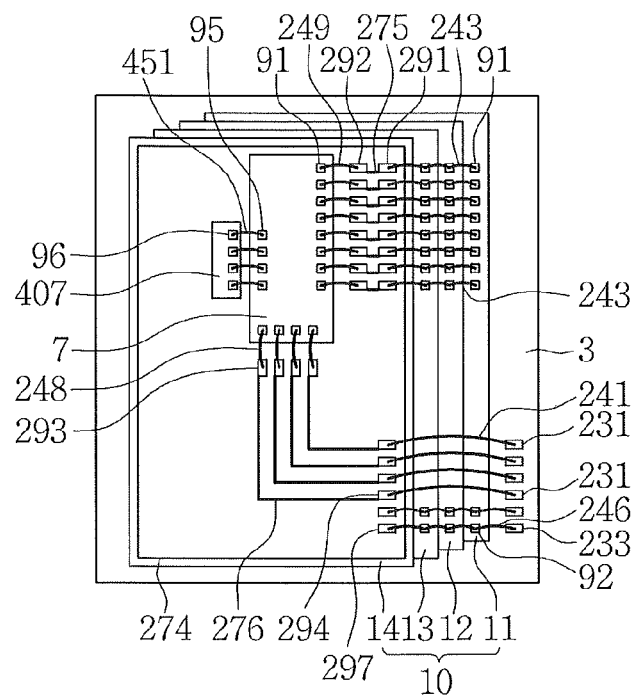
Figure 34:
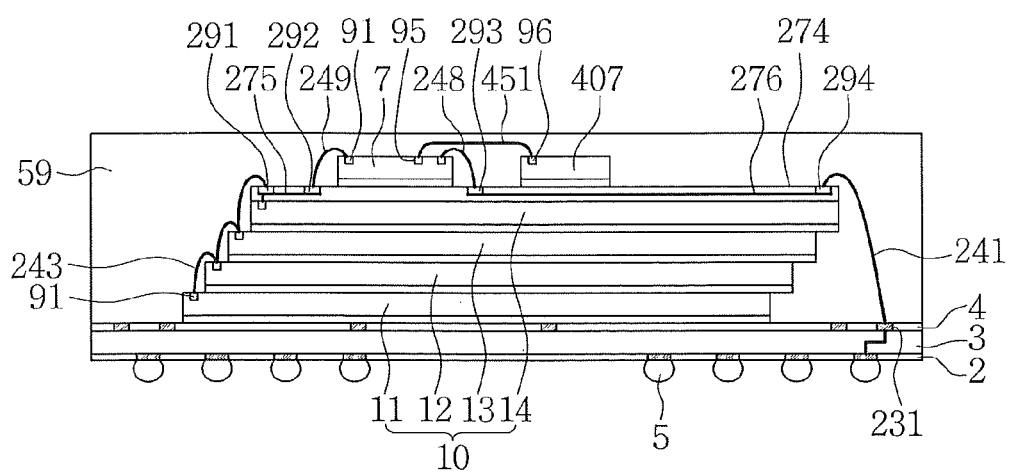

FIG. 33 is a layout for describing a semiconductor package in accordance with some embodiments of the inventive concept, and FIG. 34 is a cross-sectional view for describing a semiconductor package in accordance with some embodiments of the inventive concept.

Referring to FIGS. 33 and 34, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A logic chip 7 and an IPD 407 may be mounted on the redistribution layer 274. An encapsulant 59 covering the first chip stack 10, the logic chip 7, and the IPD 407 may be mounted on the board 3. First to fifth conductive connections 241, 243, 246, 248, and 249 and sixteenth conductive connections 451 may be provided in the encapsulant 59.

The sixteenth conductive connections 451 may be a bonding wire. The IPD 407 may include fifth data pads 96. The sixteenth conductive connections 451 may be formed between the fifth data pads 96 and the fourth data pads 95. The IPD 407 may be connected to the logic chip 7 via the sixteenth conductive connections 451. The IPD 407 may be installed close to the logic chip 7.

Figure 35:
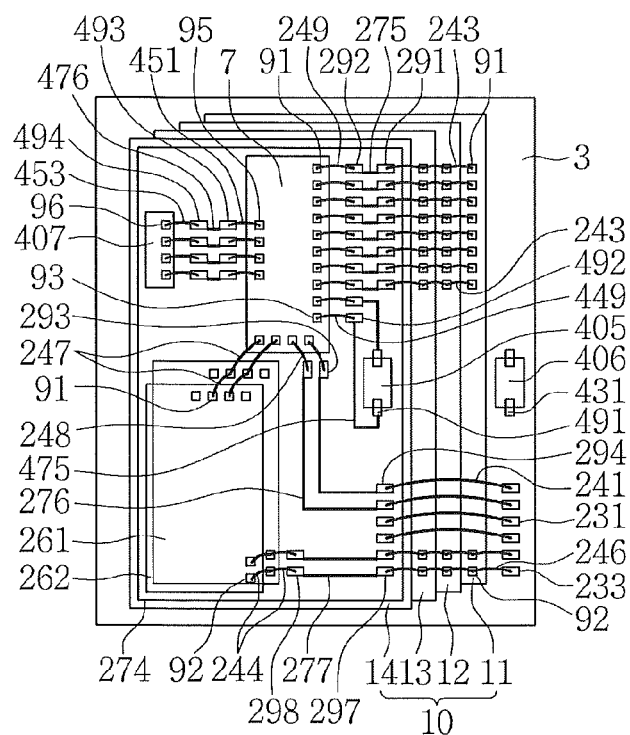

FIG. 35 is a layout for describing a semiconductor package in accordance with some embodiments of the inventive concept.

Referring to FIG. 35 a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of third redistribution patterns 277, a plurality of eighth redistribution patterns 475, a plurality of ninth redistribution patterns 476, a plurality of first redistribution pads 291, a plurality of second redistribution pads 292, a plurality of third redistribution pads 293, a plurality of fourth redistribution pads 294, a plurality of fifth redistribution pads 297, a plurality of sixth redistribution pads 298, a plurality of fifteenth redistribution pads 491, a plurality of sixteenth redistribution pads 492, a plurality of seventeenth redistribution pads 493, and a plurality of eighteenth redistribution pads 494 may be formed in the redistribution layer 274. A logic chip 7, a first buffer chip 261, a second buffer chip 262, a first decoupling capacitor 405, and an IPD 407 may be mounted on the redistribution layer 274.

First conductive connections 241, second conductive connections 243, third conductive connections 246, fourth conductive connections 248, fifth conductive connections 249, sixth conductive connections 244, seventh conductive connections 247, fourteenth conductive connections 449, sixteenth conductive connections 451, and eighteenth conductive connections 453 may be provided on the board 3. The memory chips 11, 12, 13, and 14, the first buffer chip 261, the second buffer chip 262, and the logic chip 7 may include a plurality of first data pads 91, second data pads 93, fourth data pads 95, and a plurality of power pads 92.

The first buffer chip 261 and the second buffer chip 262 may include a volatile memory device such as a DRAM or an SRAM. A second decoupling capacitor 406 may be mounted on the board 3. The first decoupling capacitor 405 and the second decoupling capacitor 406 may be an MLCC. First electrode fingers 231, second electrode fingers 233, and fifth electrode fingers 431 may be formed on the board 3. The IPD 407 may include fifth data pads 96. The first decoupling capacitor 405, the second decoupling capacitor 406, and the IPD 407 may be referred to as a passive device.

Figure 36:
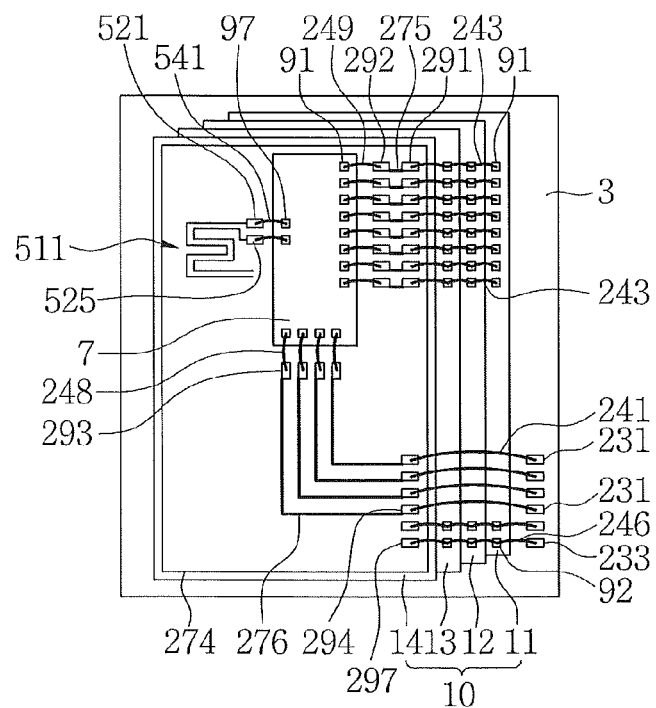
Figure 37:
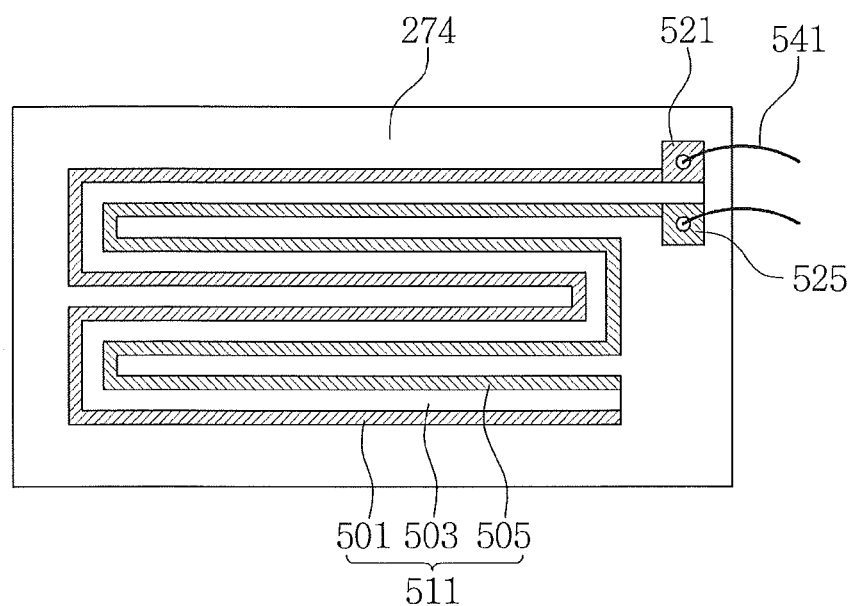
FIG. 37 is an enlarged view showing a part of FIG. 36 in detail.
Figure 38:
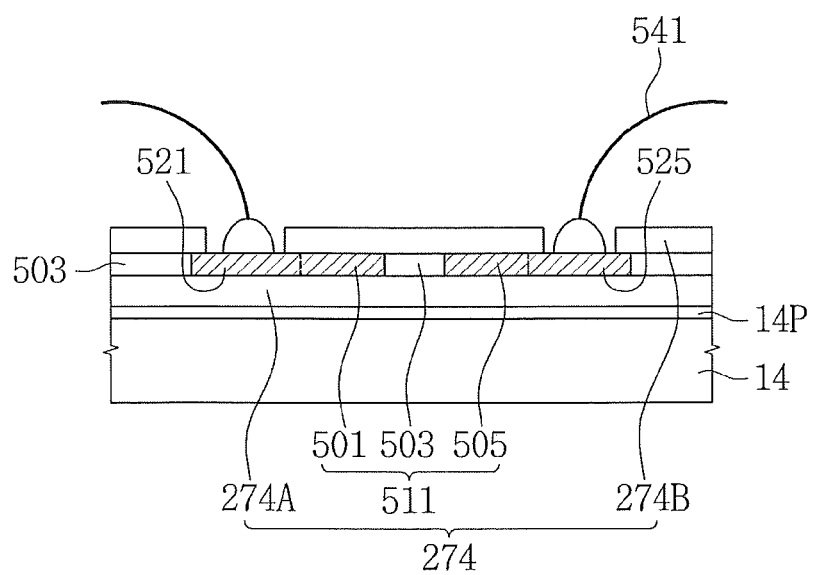

FIG. 36 is a layout for describing a semiconductor package in accordance with some embodiments of the inventive concept, FIG. 37 is an enlarged view showing a part of FIG. 36 in detail, and FIG. 38 is a cross-sectional view for describing a semiconductor package in accordance with some embodiments of the inventive concept.

Referring to FIGS. 36 and 37, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of first redistribution pads 291, a plurality of second redistribution pads 292, a plurality of third redistribution pads 293, a plurality of fourth redistribution pads 294, a plurality of fifth redistribution pads 297, and a decoupling capacitor 511 may be formed in the redistribution layer 274. A logic chip 7 may be mounted on the redistribution layer 274. First to fifth conductive connections 241, 243, 246, 248, and 249 and nineteenth conductive connections 451 may be provided on the board 3. The plurality of memory chips 11, 12, 13, and 14 and the logic chip 7 may include a plurality of first data pads 91, sixth data pads 97, and a plurality of power pads 92.

The decoupling capacitor 511 may include a first capacitor electrode 501, a second capacitor electrode 505 facing the first capacitor electrode 501, and a capacitor dielectric layer 503 formed between the first capacitor electrode 501 and the second capacitor electrode 505. A first capacitor pad 521 may be formed at an end of the first capacitor electrode 501, and a second capacitor pad 525 may be formed at an end of the second capacitor electrode 505. The first capacitor pad 521 and the second capacitor pad 525 may be connected to the sixth data pads 97 via the nineteenth conductive connections 541. The decoupling capacitor 511 may be connected to the logic chip 7 via the nineteenth conductive connections 541.

The first capacitor electrode 501 and the second capacitor electrode 505 may be parallel to each other. Each of the first capacitor electrode 501 and the second capacitor electrode 505 may be bent in a zigzag shape. Each of the first capacitor electrode 501 and the second capacitor electrode 505 may include a conductive layer such as a metal layer. The capacitor dielectric layer 503 may include silicon oxide, silicon nitride, silicon oxynitride, a high-k dielectric layer, or a combination thereof. The nineteenth conductive connections 541 may be a bonding wire. The decoupling capacitor 511 may be formed close to the logic chip 7.

In other embodiment, the decoupling capacitor 511 may be directly connected to the first data pads 91 of the uppermost memory chip 14. In some embodiments, the coupling capacitor 511 may be connected to a data transfer path between the uppermost memory chip 14 and the logic chip 7.

Referring to FIG. 38, the uppermost memory chip 14 may include a passivation insulating layer 14P. The passivation insulating layer 14P may include silicon oxide, silicon nitride, silicon oxynitride, or a combination thereof. The redistribution layer 274 may be formed on the passivation insulating layer 14P. The decoupling capacitor 511 may be formed in the redistribution layer 274.

For example, a first insulating layer 274A may be formed on the passivation insulating layer 14P. The first insulating layer 274A may be in direct contact with the passivation insulating layer 14P. The first capacitor electrode 501, the second capacitor electrode 505, the capacitor dielectric layer 503, the first capacitor pad 521, and the second capacitor pad 525 may be formed on the first insulating layer 274A. A second insulating layer 274B covering the decoupling capacitor 511 may be formed on the first insulating layer 274A. The second insulating layer 274B may cover the first capacitor electrode 501 and the second capacitor electrode 505, and expose the first capacitor pad 521 and the second capacitor pad 525. The nineteenth conductive connections 541 may be formed on the first capacitor pad 521 and the second capacitor pad 525. The first capacitor electrode 501, the second capacitor electrode 505, the capacitor dielectric layer 503, the first capacitor pad 521, and the second capacitor pad 525 may be formed to be at the same horizontal level.

In some embodiments, the redistribution layer 274 may be partially formed on the uppermost memory chip 14.

Figure 40:
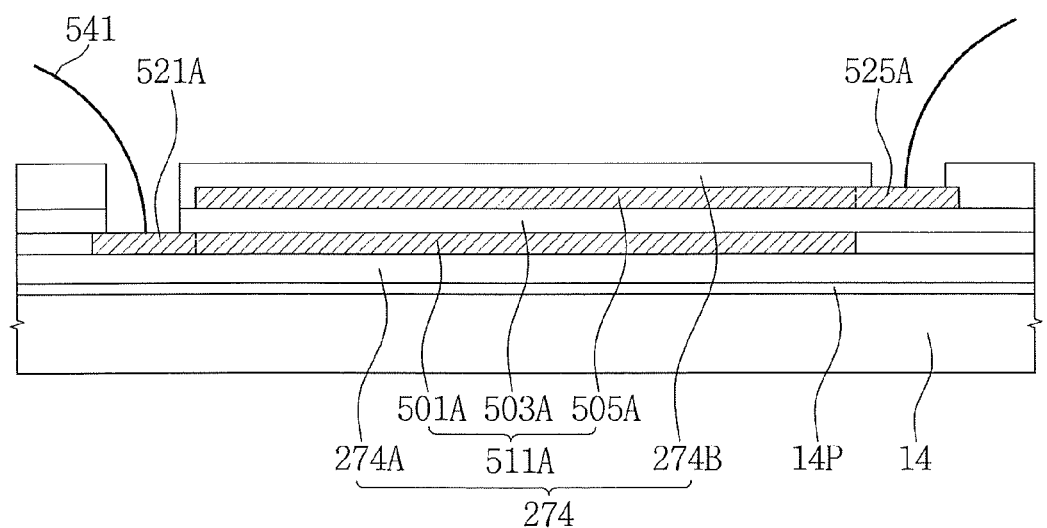

FIG. 38 is an enlarged view showing a part of a semiconductor package in accordance with some embodiments of the inventive concept, and FIG. 40 is a cross-sectional view for describing a semiconductor package in accordance with some embodiments of the inventive concept.

Figure 39:
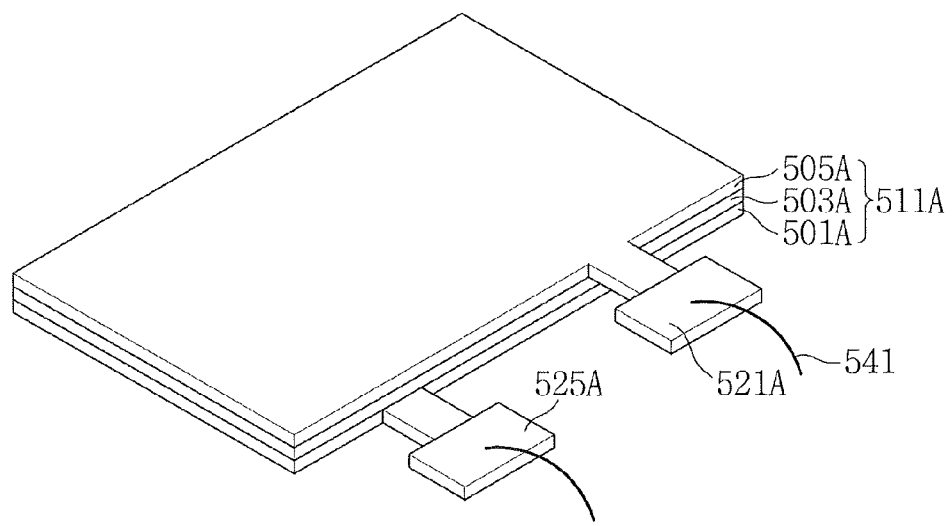
FIG. 39 is a perspective view showing a part of FIG. 36 in detail.

Referring to FIGS. 39 and 40, the uppermost memory chip 14 may include a passivation insulating layer 14P. A redistribution layer 274 may be formed on the passivation insulating layer 14P. A decoupling capacitor 511A may be formed in the redistribution layer 274. The decoupling capacitor 511A may include a first capacitor electrode 501A, a capacitor dielectric layer disposed on the first capacitor electrode 501A, and a second capacitor electrode disposed on the capacitor dielectric layer 503A. A first capacitor pad 521A may be formed at an end of the first capacitor electrode 501A, and a second capacitor pad 525A may be formed at an end of the second capacitor electrode 505A. Nineteenth conductive connections 541 may be formed on the first capacitor pad 521A and the second capacitor pad 525A.

The capacitor dielectric layer 503A may cover the first capacitor electrode 501A. The capacitor dielectric layer 503A may be interposed between the first capacitor electrode 501A and the second capacitor electrode 505A. The capacitor dielectric layer 503A may be in contact with the first capacitor electrode 501A and the second capacitor electrode 505A.

Figure 41:
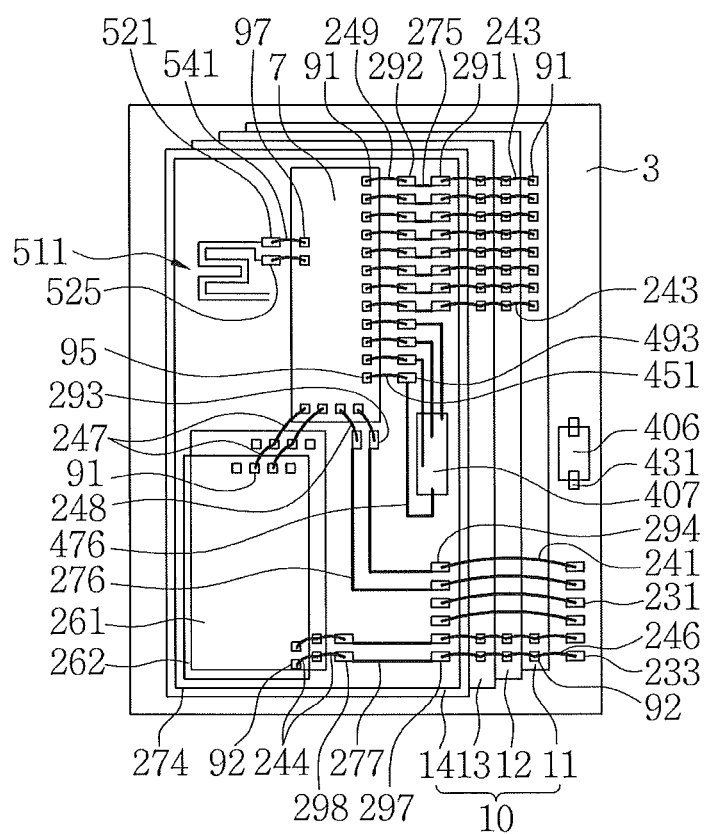

FIG. 41 is a layout for describing a semiconductor package in accordance with some embodiments of the inventive concept.

Referring to FIG. 41, a first chip stack 10 may be mounted on the board 3. The first chip stack 10 may include a plurality of memory chips 11, 12, 13, and 14. A redistribution layer 274 may be formed on the uppermost memory chip 14 among the plurality of memory chips 11, 12, 13, and 14. A plurality of first redistribution patterns 275, a plurality of second redistribution patterns 276, a plurality of third redistribution patterns 277, a plurality of ninth redistribution patterns 476, a plurality of first redistribution pads 291, a plurality of second redistribution pads 292, a plurality of third redistribution pads 293, a plurality of fourth redistribution pads 294, a plurality of fifth redistribution pads 297, a plurality of sixth redistribution pads 298, a plurality of seventeenth redistribution pads 493, and a first decoupling capacitor 511 may be formed in the redistribution layer 274. A logic chip 7, a first buffer chip 261, a second buffer chip 262, and an IPD 407 may be mounted on the redistribution layer 274.

First conductive connections 241, second conductive connections 243, third conductive connections 246, fourth conductive connections 248, fifth conductive connections 249, sixth conductive connections 244, seventh conductive connections 247, sixteenth conductive connections 451, and nineteenth conductive connections 541 may be formed on the board 3. The memory chips 11, 12, 13, and 14, the first buffer chip 261, the second buffer chip 262, and the logic chip 7 may include a plurality of first data pads 91, fourth data pads 95, sixth data pads 97, and a plurality of power pads 92.

The first decoupling capacitor 511 may include a first capacitor pad 521 and a second capacitor pad 525. The first capacitor pad 521 and the second capacitor pad 525 may be connected to the sixth data pads 97 through the nineteenth conductive connections 541. A second decoupling capacitor 406 may be installed on the board 3. The second decoupling capacitor 406 may be an MLCC. First electrode fingers 231, second electrode fingers 233, and fifth electrode fingers 431 may be formed on the board 3.

As described with reference to FIGS. 1 to 41, the configuration of the redistribution layer 274, the memory chips 11, 12, 13, and 14, the logic chip 7, the buffer chips 261 and 262, the IPD 407, and the decoupling capacitors 405, 406, and 511 may reduce the signal transfer path, improve the operation speed, and be effective in reducing the size. For example, the memory chips 11, 12, 13, and 14 may be electrically connected to the board 3 via the logic chip 7 and the redistribution layer 274. Since the signal transfer path between the memory chips 11, 12, 13, and 14 and the logic chip 7 is reduced, the operation speed of the semiconductor package may increase. No wiring which functions to transfer a data signal between the logic chip 7 and the memory chips 11, 12, 13, and 14 is required in the board 3.

The board internal wirings 321, 322, and 323 formed in the board 3 may be simple. The ability to supply power and transfer a signal of the board 3 may be improved. Due to the configuration of the redistribution layer 274, the degree of freedom in positioning the locations on which the logic chip 7, the buffer chips 261 and 262, the IPD 407, and the decoupling capacitors 405, 406, and 511 are mounted may be improved. Due to the configuration of the redistribution layer 274, very effective means for reducing the size of the semiconductor package may be provided.

In some embodiments, the signal transfer path between the memory chips 11, 12, 13, and 14, the logic chip 7, the buffer chips 261 and 262, the IPD 407, and the decoupling capacitors 405, 406, and 511 may be configured in various ways. For example, some of the memory chips 11, 12, 13, and 14 or the buffer chips 261 and 262 may be electrically connected to the logic chip via the board 3.

Figure 42:
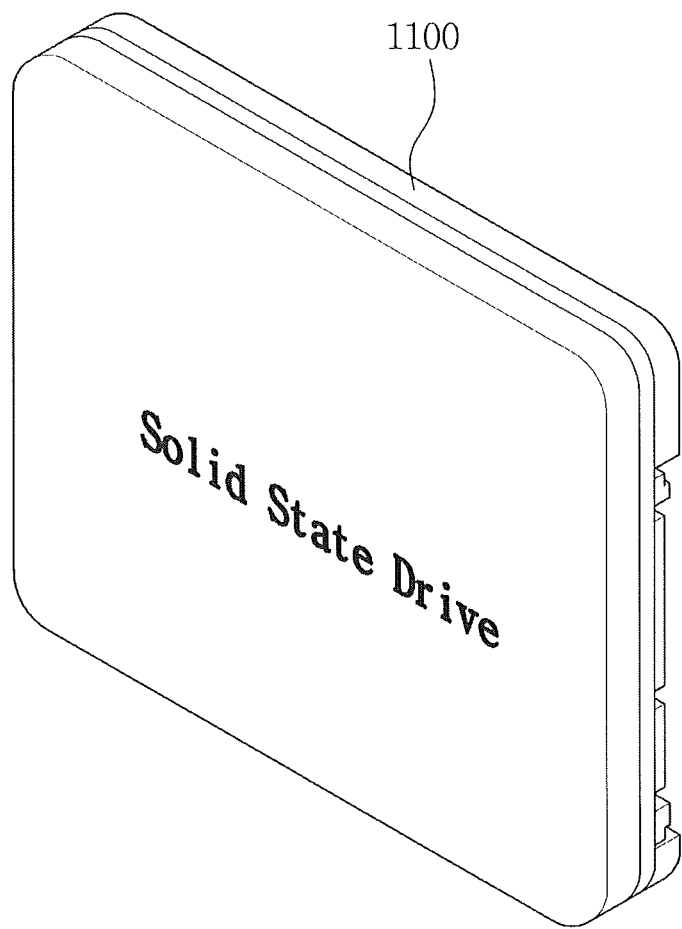
FIGS. 42 to 47 are perspective views and system block diagrams showing electronic apparatuses in accordance with some embodiments of the inventive concept.
Figure 43:
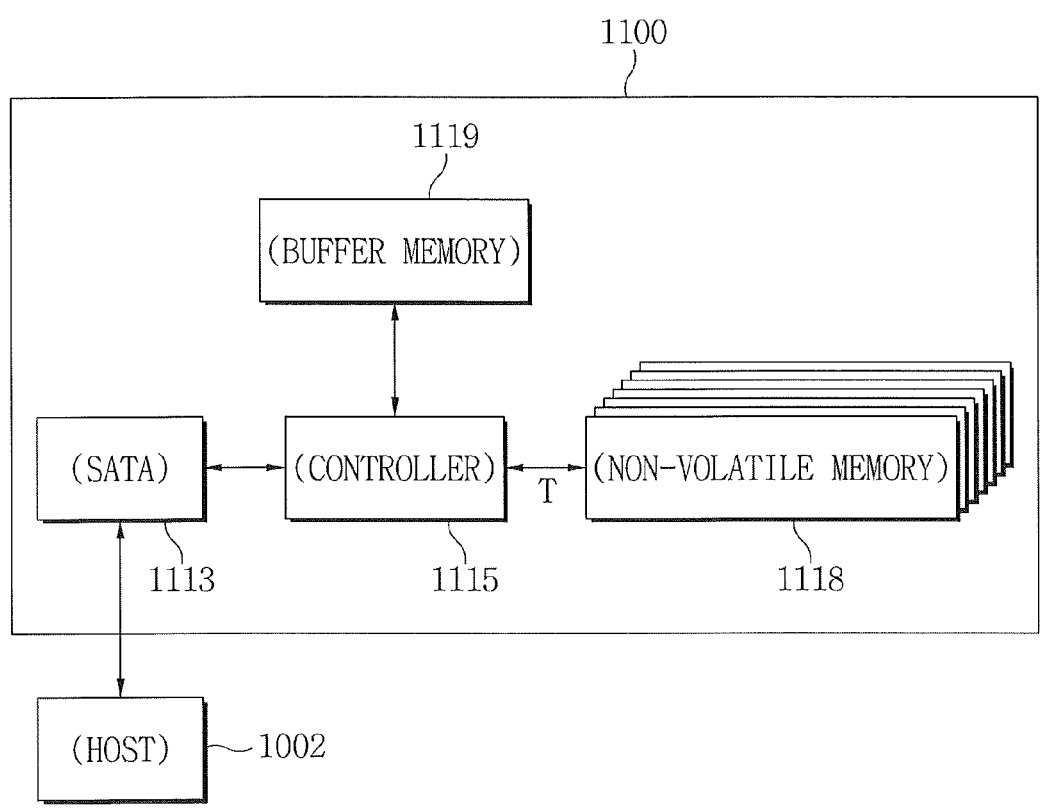

FIG. 42 is a perspective view showing an electronic apparatus in accordance with some embodiments of the inventive concept, and FIG. 43 is a system block diagram showing an electronic apparatus in accordance with some embodiments of the inventive concept. The electronic apparatus may be a data storage apparatus such as a solid state drive (SSD) 1100.

Referring to FIGS. 42 and 43, the SSD 1100 may include an interface 1113, a controller 1115, a non-volatile memory 1118, and a buffer memory 1119. The solid state drive 1100 is an apparatus that stores information using a semiconductor device. The SSD 1100 is faster, has a lower mechanical delay or failure rate, and generates less heat and noise than a hard disk drive (HDD). Further, the SSD 1100 may be smaller and lighter than the HDD. The SSD 1100 may be widely used in a laptop computer, a notebook PC, a desktop PC, an MP3 player, or a portable storage device.

The controller 1115 may be formed adjacent to the interface 1113 and electrically connected thereto. The controller 1115 may be a microprocessor including a memory controller and a buffer controller. The non-volatile memory 1118 may be formed adjacent to the controller 1115 and electrically connected thereto. Data storage capacity of the SSD 1100 may correspond to a capacity of the non-volatile memory 1118. The buffer memory 1119 may be formed close to the controller 1115 and electrically connected thereto.

The interface 1113 may be connected to a host 1002, and may send and receive electrical signals such as data. For example, the interface 1113 may be a device using a standard such as Serial Advanced Technology Attachment (SATA), Integrated Drive Electronics (IDE), Small Computer System Interface (SCSI), and/or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a DRAM and/or an SRAM. The buffer memory 1119 has a relatively faster operating speed than the non-volatile memory 1118.

Data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently used items among the data stored in the non-volatile memory 1118 may be pre-read and temporarily stored in the buffer memory 1119. That is, the buffer memory 1119 may function to increase an effective operating speed and reduce an error rate of the SSD 1100.

The non-volatile memory 1118, the buffer memory 1119, and the controller 1115 may have similar configurations to those described with reference to FIGS. 1 to 41. For example, the non-volatile memory 1118, the buffer memory 1119, and the controller 1115 may be installed in a single semiconductor package. In some embodiments, the non-volatile memory 1118 and the controller 1115 may be installed in a first semiconductor package, and the buffer memory 1119 may be installed in a second semiconductor package. In some embodiments, the non-volatile memory 1118 may be installed in a first semiconductor package, the buffer memory 1119 may be installed in a second semiconductor package, and the controller 1115 may be installed in a third semiconductor package. The electrical properties of the solid state drive 1100 may be improved.

Figure 44:
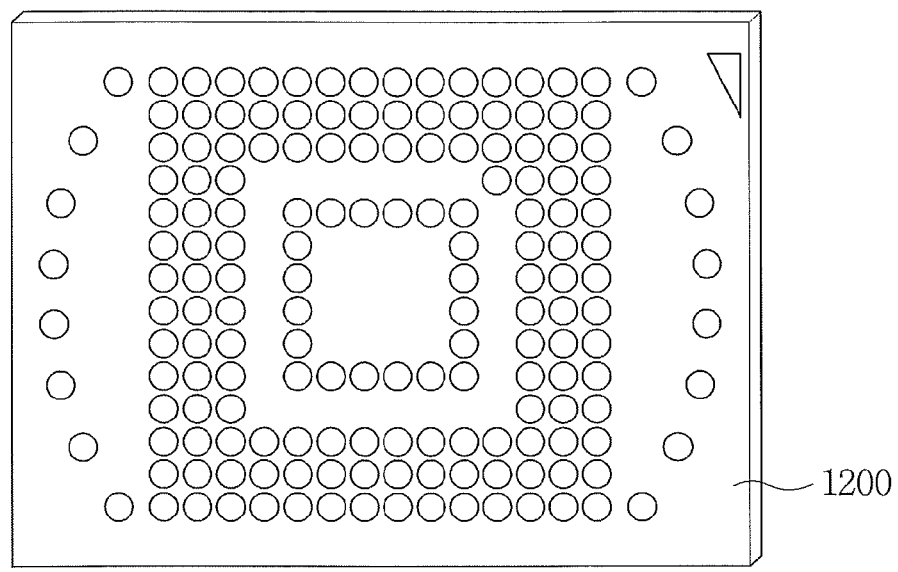
Figure 45:
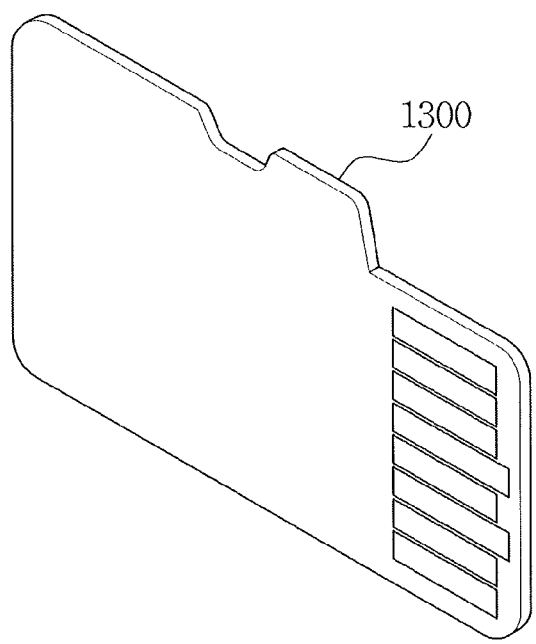
Figure 46:
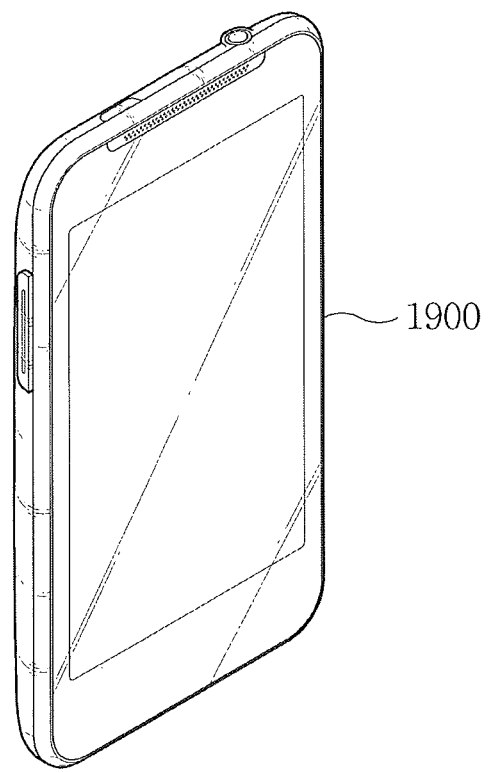
Figure 47:
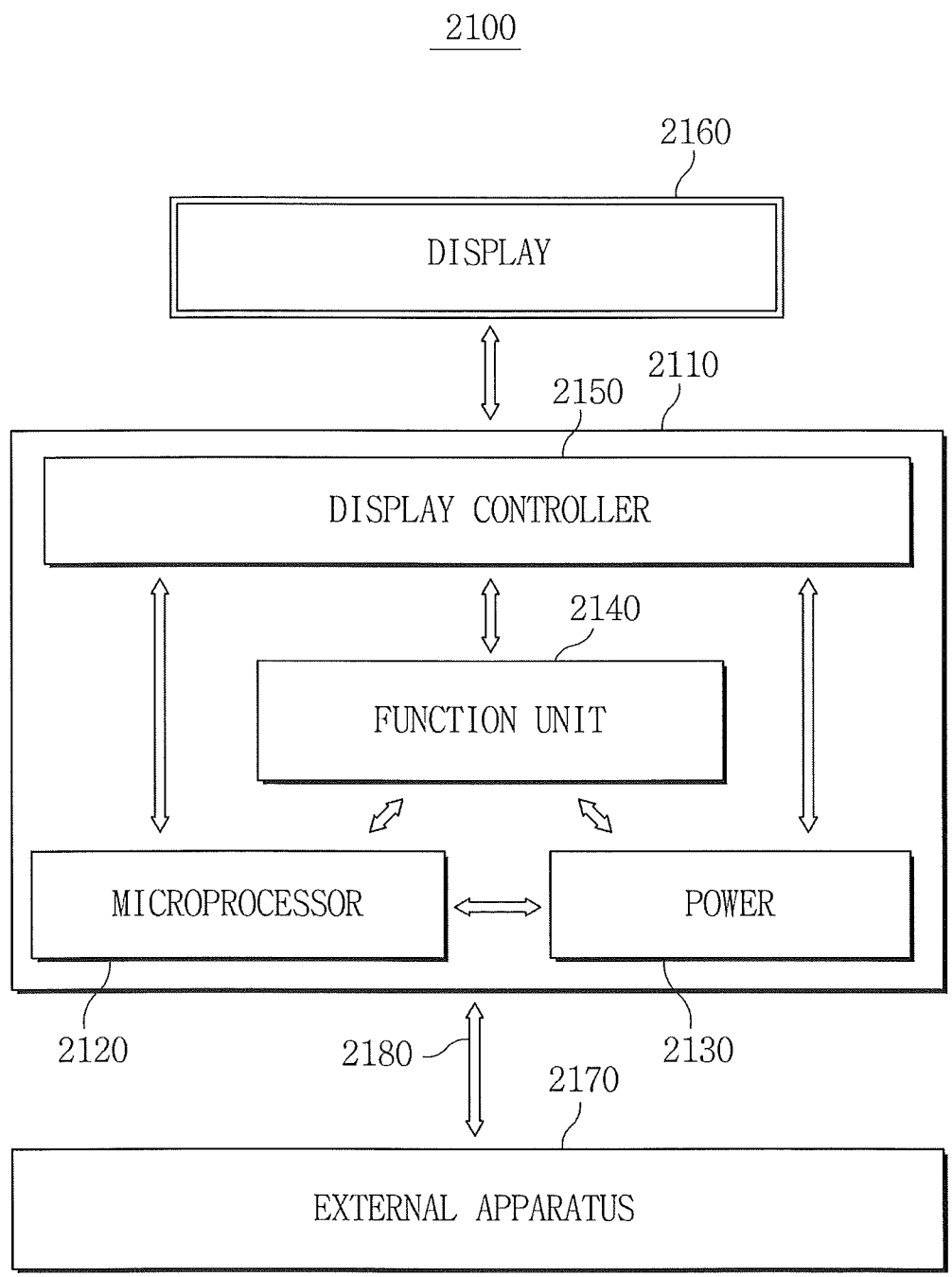

FIGS. 44 to 46 are perspective views showing electronic apparatuses in accordance with some embodiments of the inventive concept, and FIG. 47 is a system block diagram showing electronic apparatuses in accordance with some embodiments of the inventive concept.

Referring to FIGS. 44 to 46, the semiconductor package described with reference to FIGS. 44 to 46 may be usefully applied to electronic systems such as an embedded multimedia chip (eMMC) 1200, a micro SD 1300, a mobile phone 1900, a netbook, a notebook, or a tablet PC. For example, the semiconductor package described with reference to FIGS. 44 to 46 may be mounted on a mainboard in the mobile phone 1900. The semiconductor package described with reference to FIGS. 44 to 46 may be provided in an expansion apparatus such as a micro SD 1300 to be combined with the mobile phone 1900.

Referring to FIG. 47, the semiconductor package described with reference to FIGS. 44 to 46 may be applied to an electronic system 2100. The electronic system 2100 may include a body 2110, a microprocessor unit 2120, a power unit 2130, a function unit 2140, and a display controller unit 2150. The body 2110 may be a motherboard having a printed circuit board (PCB). The microprocessor unit 2120, the power unit 2130, the function unit 2140, and the display controller unit 2150 may be installed on the body 2110. A display unit 2160 may be installed inside or outside of the body 2110. For example, the display unit 2160 may be disposed on a surface of the body 2110 to display an image processed by the display controller unit 2150. The power unit 2130 may function to receive a constant voltage from an external battery, etc., divide the voltage into required levels, and supply those voltages to the microprocessor unit 2120, the function unit 2140, and the display controller unit 2150. The microprocessor unit 2120 may receive the voltage from the power unit 2130 to control the function unit 2140 and the display unit 2160. The function unit 2140 may perform functions of various electronic systems 2100. For example, if the electronic system 2100 is a cellular phone, the function unit 2140 may have several components which can perform functions of a cellular phone such as dialing, video output to the display unit 2160 through communication with an external apparatus 2170, and sound output to a speaker, and if a camera is installed, the function unit 2140 may function as a camera image processor.

In the embodiment to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. Further, when the electronic system 2100 needs a universal serial bus (USB), etc. in order to expand functionality, the function unit 2140 may function as an interface controller. The function unit 2140 may include a mass storage device.

A semiconductor package similar to that described with reference to FIGS. 1 to 41 may be applied to the microprocessor unit 2120 or the function unit 2140. For example, the function unit 2140 may include the board 3, the buffer chips 261 and 262, the memory chips 11, 12, 13, and 14, the redistribution layer 274, and the logic chip 7. The board 3 may be electrically connected to the body 2110. The electronic system 2100 may be formed to be light, thin, short, and small while being installed with a plurality of semiconductor chips, and shows high speed operation characteristics due to the reduction of the signal transfer path.

According to the embodiments of the inventive concept, a semiconductor package in which a plurality of memory chips, a passive device, and a logic chip are installed is provided on a board. A redistribution layer may be formed on the uppermost memory chip among the memory chips. The memory chips are connected to the logic chip via the redistribution layer using conductive connections such as a bonding wire. The logic chip is mounted to be close to the data pads of the memory chips. The data transfer path between the logic chip and the memory chips may be reduced. The board may not need wirings for transferring data between the logic chip and the memory chips. The passive device may be mounted close to the logic chip and connected to the logic chip. In some embodiments, a semiconductor package in which a buffer chip, a support, an adhesive layer, a plurality of memory chips, and a logic chip are installed may be provided on a board. A redistribution layer may be formed on the uppermost memory chip among the memory chips. A semiconductor package which is useful in reducing the signal transfer path, structurally stable, and formed to be light, thin, short, and small while being installed with a plurality of semiconductor chips, may be implemented.

The above-disclosed subject matter is to be considered illustrative, and not restrictive, and the appended claims are intended to cover all such modifications, enhancements, and some embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:
1. A semiconductor package, comprising:
a plurality of first semiconductor chips comprising an uppermost first semiconductor chip on a board, the plurality of first semiconductor chips including respective ones of a plurality of data pads and respective ones of a plurality of power pads, and the plurality of data pads comprising a first data pad in the uppermost first semiconductor chip;
a wiring layer on the uppermost first semiconductor chip, the wiring layer including a redistribution pattern and a redistribution pad;

a second semiconductor chip on the uppermost first semiconductor chip, the second semiconductor chip being electrically connected to the redistribution pattern;

a plurality of first conductive connections between two of the plurality of data pads;

a second conductive connection between the uppermost first semiconductor chip and the second semiconductor chip;

a third conductive connection between the second semiconductor chip and the board, wherein the redistribution pattern is between the second semiconductor chip and the board, wherein the redistribution pad comprise:

a first redistribution pad between the first data pad in the uppermost first semiconductor chip and the second semiconductor chip;

a second redistribution pad electrically connected to the redistribution pattern; and a third redistribution pad electrically connected to the redistribution pattern, the third redistribution pad contacting the third conductive connection, wherein the second semiconductor chip is closer to the first redistribution pad than the third redistribution pad, and wherein one of the plurality of data pads is electrically connected to the board via the first redistribution pad, the second conductive connection, the second semiconductor chip, the second redistribution pad, the redistribution pattern, the third redistribution pad and the third conductive connection, sequentially.

2. The semiconductor package of claim 1, a center of the second semiconductor chip is closer to one of the plurality of data pads than one of the plurality of power pads.

3. A semiconductor package, comprising:

a plurality of first semiconductor chips comprising an uppermost first semiconductor chip on a board, the plurality of first semiconductor chips including respective ones of a plurality of data pads and respective ones of a plurality of power pads, and the plurality of data pads comprising a first data pad in the uppermost first semiconductor chip;

a wiring layer on the uppermost first semiconductor chip, the wiring layer including a redistribution pattern and a redistribution pad;

a second semiconductor chip on the uppermost first semiconductor chip, the second semiconductor chip being electrically connected to the redistribution pattern;

a plurality of first conductive connections between two of the plurality of data pads;

a second conductive connection between the uppermost first semiconductor chip and the second semiconductor chip;

a third conductive connection between the second semiconductor chip and the board, wherein the redistribution pattern comprises a first redistribution pattern between the uppermost first semiconductor chip and the second semiconductor chip and a second redistribution pattern between the second semiconductor chip and the board, wherein the first redistribution pattern does not overlaps with the second redistribution pattern and is shorter than the second redistribution pattern, and wherein one of the plurality of data pads is electrically connected to the board via the first redistribution pattern, the second conductive connection, the second semiconductor chip, the second redistribution pattern, and the third conductive connection, sequentially.

4. The semiconductor package of claim 1, wherein all of the plurality of data pads are electrically connected to the board via the second semiconductor chip.

5. The semiconductor package of claim 4, wherein the board includes a board internal wiring, and the board internal wiring is connected to one of the plurality of power pads or the second semiconductor chip.

6. The semiconductor package of claim 4, wherein the board is free of a wiring connecting one of the plurality of data pads and the second semiconductor chip.

7. The semiconductor package of claim 1, wherein a ratio of a longer side to a shorter side of the second semiconductor chip is about 1.2 or less.

8. The semiconductor package of claim 1, wherein one of the plurality of power pads is connected to the board without going through the second semiconductor chip.

9. The semiconductor package of claim 1, further comprising:

a buffer chip electrically connected to the second semiconductor chip.

10. The semiconductor package of claim 9, wherein the buffer chip is on the wiring layer.

11. The semiconductor package of claim 10, wherein the redistribution pattern comprises:

a first redistribution pattern between the first data pad in the uppermost first semiconductor chip and the second semiconductor chip;

a second redistribution pattern between the second semiconductor chip and the board; and a third redistribution pattern between the second semiconductor chip and the buffer chip, and wherein the buffer chip is connected to the second semiconductor chip via the third redistribution pattern.

12. The semiconductor package of claim 1, wherein the plurality of first semiconductor chips comprises:

a first chip stack including a first portion of the plurality of first semiconductor chips that are sequentially offset-aligned in a first direction; and a second chip stack including a second portion of the plurality of first semiconductor chips that are sequentially offset-aligned in a second direction that is different from the first direction, the second chip stack being between the first chip stack and the board, and the semiconductor package further comprising an intermediate wiring layer between the first chip stack and the second chip stack, wherein one of the plurality of first semiconductor chips in the second chip stack is electrically connected to the wiring layer via the intermediate wiring layer.

13. A semiconductor package, comprising:

a board including a board electrode;

a top chip on the board including a first top chip data pad and a second top chip data pad;

an intervening chip between the board and the top chip, the intervening chip including an intervening chip data pad that is electrically connected to the first top chip data pad;

a wiring layer on the intervening chip;

a first conductive connection between the intervening chip and the top chip; and a second conductive connection between the top chip and the board, wherein the wiring layer comprises:
a redistribution pattern;
a first redistribution pad between the intervening chip and the top chip;
a second redistribution pad electrically connected to the redistribution pattern; and
a third redistribution pad electrically connected to the redistribution pattern, the third redistribution pad contacting the second conductive connection,
wherein the top chip is closer to the first redistribution pad than the third redistribution pad, and
wherein the intervening chip data pad is electrically connected to the board via the first redistribution pad, the first conductive connection, the top chip, the second redistribution pad, the redistribution pattern, the third redistribution pad and the second conductive connection, sequentially.

14. The semiconductor package of claim 13, wherein the intervening chip comprises a first intervening chip including a first intervening chip data pad that is electrically connected to the first top chip data pad and a second intervening chip between the first intervening chip and the board, the second intervening chip including a second intervening chip data pad and the semiconductor package further comprising:
a chip connector connecting the first intervening chip data pad to the second intervening chip data pad;
wherein the second intervening chip data pad is electrically connected to the board electrode via the chip connector, the first top chip data pad, the top chip, the second top chip data pad and the wiring layer.

15. The semiconductor package of claim 13, wherein the wiring layer comprises:
an insulation layer, and the redistribution pattern, the first redistribution pad, the second redistribution pad and the third redistribution pad are in the insulating layer, and
wherein the second top chip data pad, the second redistribution pad, the third redistribution pad and the board electrode are daisy-chained together.

16. The semiconductor package of claim 13, wherein a portion of the wiring layer is between the top chip and the intervening chip and overlaps with the top chip.

17. The semiconductor package of claim 13, further comprising a passive device on a first surface of the intervening chip on which the top chip located, wherein the passive device is electrically connected to the top chip and does not overlap with the top chip.

18. The semiconductor package of claim 13, wherein the wiring layer includes a decoupling capacitor that is electrically connected to the top chip.

19. The semiconductor package of claim 14, wherein a third data path from the second intervening chip to the top chip is shorter than a shortest data path from the top chip to the board.

20. The semiconductor package of claim 14, wherein each of the top chip, the first intervening chip and the second intervening chip comprises two opposing long sides and two opposing short sides shorter than the corresponding long sides, and
wherein the long sides of the top chip, the long sides of the first intervening chip and the long sides of the second intervening chip extend in a first direction.

21. The semiconductor package of claim 1, wherein a longest data path from one of the plurality of first semiconductor chips to the second semiconductor chip is shorter than a shortest data path from the second semiconductor chip and the board.

22. The semiconductor package of claim 1, wherein each of the plurality of first semiconductor chips and the second semiconductor chip comprises two opposing long sides and two opposing short sides that have a length shorter than a length of the corresponding long sides, and
wherein the long sides of the plurality of first semiconductor chips and the long sides of the second semiconductor chip extend in a first direction.

23. The semiconductor package of claim 1, wherein a first data path starting at one of the plurality of first semiconductor chips and ending at the second semiconductor chip is shorter than a second data path starting at the second semiconductor chip and ending at the board.

24. The semiconductor package of claim 3, a center of the second semiconductor chip is closer to one of the plurality of data pads than one of the plurality of power pads.

25. The semiconductor package of claim 3, wherein all of the plurality of data pads are electrically connected to the board via the second semiconductor chip.

26. The semiconductor package of claim 3, wherein each of the plurality of first semiconductor chips and the second semiconductor chip comprises two opposing long sides and two opposing short sides that have a length shorter than a length of the corresponding long sides, and
wherein the long sides of the plurality of first semiconductor chips and the long sides of the second semiconductor chip extend in a first direction.

27. The semiconductor package of claim 3, wherein a first data path starting at one of the plurality of first semiconductor chips and ending at the second semiconductor chip is shorter than a second data path starting at the second semiconductor chip and ending at the board.

28. The semiconductor package of claim 13, wherein a first data path starting at the intervening chip and ending at the top chip is shorter than a second data path starting at the top chip and ending at the board.

29. The semiconductor package of claim 13, wherein the redistribution pattern contacts both the second redistribution pad and the third redistribution pad.

30. The semiconductor package of claim 29, wherein the first conductive connection contacts both the first redistribution pad and the first top chip data pad.

* * * * *